(12) United States Patent
Hayashi

(10) Patent No.: US 7,270,849 B2
(45) Date of Patent: Sep. 18, 2007

(54) ORGANIC SILOXANE COPOLYMER FILM, METHOD AND DEPOSITION APPARATUS FOR PRODUCING SAME, AND SEMICONDUCTOR DEVICE USING SUCH COPOLYMER FILM

(75) Inventor: Yoshihiro Hayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 191 days.

(21) Appl. No.: 10/521,238

(22) PCT Filed: Jul. 15, 2003

(86) PCT No.: PCT/JP03/08989

§ 371 (c)(1), (2), (4) Date: Jan. 14, 2005

(87) PCT Pub. No.: WO2004/008517

PCT Pub. Date: Jan. 22, 2004

(65) Prior Publication Data

US 2005/0267253 A1    Dec. 1, 2005

(30) Foreign Application Priority Data

Jul. 15, 2002    (JP)  .............................. 2002-205468

(51) Int. Cl.
*C23C 14/06*    (2006.01)
(52) U.S. Cl. ................. 427/255.27; 428/447; 428/448; 428/450; 528/32; 528/37
(58) Field of Classification Search .................... None
See application file for complete search history.

(56) References Cited

U.S. PATENT DOCUMENTS 6,030,706 A    2/2000  Eissa et al.
6,486,082 B1 *    11/2002  Cho et al. .................... 438/789
6,495,208 B1 *    12/2002  Desu et al. ............ 427/255.31
2004/0033373 A1 *    2/2004  Rose et al. .................. 428/447

FOREIGN PATENT DOCUMENTS

| GB | 2343453 A | 5/2000 |
| WO | WO 99/55526 A1 | 11/1999 |
| WO | WO 03/002629 A1 | 1/2003 |
| WO | WO 2005/071752 A1 * | 4/2005 |

* cited by examiner

*Primary Examiner*—Marc S. Zimmer
(74) *Attorney, Agent, or Firm*—Sughrue Mion Pllc.

(57) ABSTRACT

An insulated organic copolymer is provided, having the excellent mechanical strength and deposition property at an interface contacting the lower base or the upper layer of the inorganic insulation film, and the effective dielectric constant is low as the whole film, which is suitable as the interlayer insulation film that separates the multi-layer copper wirings of the semiconductor device. The organosiloxane copolymer film is obtained by the polymerization of the cyclosiloxane and the straight-chain siloxane as the raw materials by the plasma excitation of both. At the interfaces contacting the inorganic insulation films, the interface layers having a film quality that is intricate and excellent in deposition property are prepared whereby the main component of the film composition is the straight-chain siloxane. The inner section of the copolymer film mixes the cyclosiloxane component having pores surrounded by the cyclosiloxane backbone and the straight-chain siloxane components, has the network structure layer relatively suppressing the density, and has the composition changing in the thickness direction whereby the multi-layer wirings embedding the copper thin film is formed.

6 Claims, 13 Drawing Sheets

ORGANIC SILOXANE COPOLYMER FILM, METHOD AND DEPOSITION APPARATUS FOR PRODUCING SAME, AND SEMICONDUCTOR DEVICE USING SUCH COPOLYMER FILM

FIELD OF THE INVENTION

The present invention relates to an organosiloxane copolymer film used as an organic insulation film for insulating between wirings that connect between elements within a semiconductor device, its production method, its deposition apparatus, and a semiconductor device using the copolymer film. More specifically, the present invention relates to a vapor-deposited organosiloxane copolymer film and a vapor deposition method of the copolymer film conforming to the application to the semiconductor devices.

BACKGROUND OF THE INVENTION

The design rule of a semiconductor integrated circuit is continuously being shrinked, accompanied by the performance deterioration due to wiring delay which is becoming prominent. That is, a wiring signal delay of a semiconductor integrated circuit is determined by a wiring CR time constant (C: wiring capacity, R: wiring resistance). Because of the increase in wiring resistance due to the decrease in a wire width and the increase in a capacity due to the decrease in a gap between wires, there is a danger that the wiring CR time constant may not catch up with the improvement in switching speed of transistors. Conventionally, an aluminum alloy was mainly used as a wiring material of a semiconductor integrated circuit. However, a copper wiring has been used in an integrated circuit requiring high-speed operation for a purpose of decreasing the resistance in a wiring.

In order to reduce the capacitance between wirings, an insulation film material that has a lower dielectric constant than the currently used silica ($SiO_2$) is beginning to be adopted. As an insulation film having a low dielectric constant, a fluorine-containing silica (SiOF), a porous silica, and an organic polymer film (organic insulation film) are known. The fluorine-containing silica is already being used in part of some products, however, if the fluorine concentration inside the film is increased for promoting a low dielectric constant of the film itself, the problem of corrosion of a wiring metal occurs with hydrofluoric acid generated from a reaction with moisture or hydrogen, or the problem of the increased dielectric constant occurs by desorption of fluorine. Furthermore, as the technology of the semiconductor integrated circuit progresses, the fluorine-containing silica film (SiOf) providing the dielectric constant of 3.3 can no longer meet the requirement of the insulation film. The insulation film that does not contain fluorine and has the dielectric constant of 3 or less is in high demand as the interlayer insulation film of the multi-layer wirings. As one of the candidates, the organosiloxane copolymer film having excellent properties both in heat and moisture resistance has been in urgent demand for development. Conventionally reported methods of forming the organosiloxane copolymers are broadly classified to the spin coating method and the CVD method.

1. First Related Art

In the spin coating method, a raw material organosiloxane monomer is dissolved in an organic solvent. The spin-coated film is formed, the solvent is removed during the film formation, the organosiloxane monomer inside the coated film is heated, and a polymerization reaction of the monomer proceeds. Consequently, a two-dimensional or three-dimensional network structure polymer film is formed by the thermal polymerization reaction. A backbone configuring the organosiloxane copolymer film which is the product, depends on the structure of the organosiloxane monomer dissolved in the organic solvent.

For example, according to "REAL-TIME FT-IR STUDIES OF THE REACTION KINETICS FOR THE POLYMERIZATION OF DIVINYL SILOXANE BIS BENZO-CYCLO BUTENE MONOMERS" (material Research Symposium Proceeding vol, 227, p, 103, 1991), by T. M. Stokich, Jr., W. M. Lec, and R. A. Peters discloses the method of forming an organosiloxane polymer film. After dissolving a divinylsiloxane-bisbenzocyclobutene (BCB-DVS) monomer which is one type of the straight-chain siloxane in a mesitylene which is spincoated, the mesitylene in the solvent is removed by baking at 100 degrees Celsius, and the residue was further heated up to 300 degrees Celsius to 350 degrees Celsius to obtain the organosiloxane polymer film. A divinylsiloxane-bisbenzocyclobutene monomer, as shown in chemical formula (1) below, is an organosiloxane monomer that includes 2 vinyl groups and 2 cyclobutene groups which are unsaturated hydrocarbon chains, and the straight-chain siloxane. Its thermal polymerization reaction is progressed as follows.

[Chemical Formula (1)]

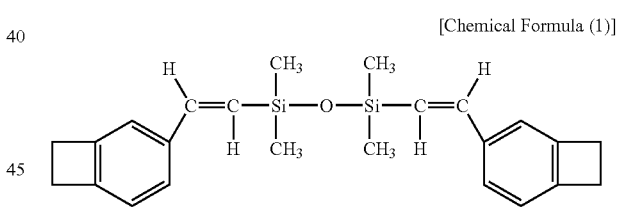

Chemical Formula (1): divinylsiloxane-bisbenzocyclobutene

First of all, accompanied by the reaction of chemical formula (2) shown below, the cyclobutene group inside the divinylsiloxane-bisbenzocyclobutene monomer undergoes thermal ring-opening polymerization reaction by thermal energy, and changes to 2 vinyl groups (methylene groups).

[Chemical Formula (2)]

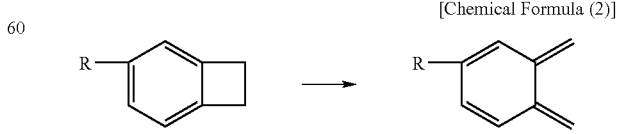

Chemical Formula (2): Ring-Opening Reaction of Benzocyclobutene Group

Accompanied by the reaction of chemical formula (3) shown below, 2 vinyl groups (methylene groups) react to another vinyl group inside the BSB-DVS monomer to form the 6-membered hydrocarbon (dihydronaphthalene) so that the polymerization reaction is generated. From this reaction path, a dimer that connects 2 BSB-DVD shown in chemical formula (4) below, is obtained.

[Chemical Formula (3)]

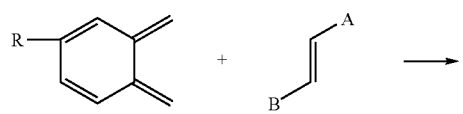

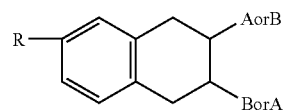

Chemical Formula (3): Addition Polymerization Reaction of Vinyl Group and Open-Ring Group of Benzocyclobutene Group.

[Chemical Formula (4)]

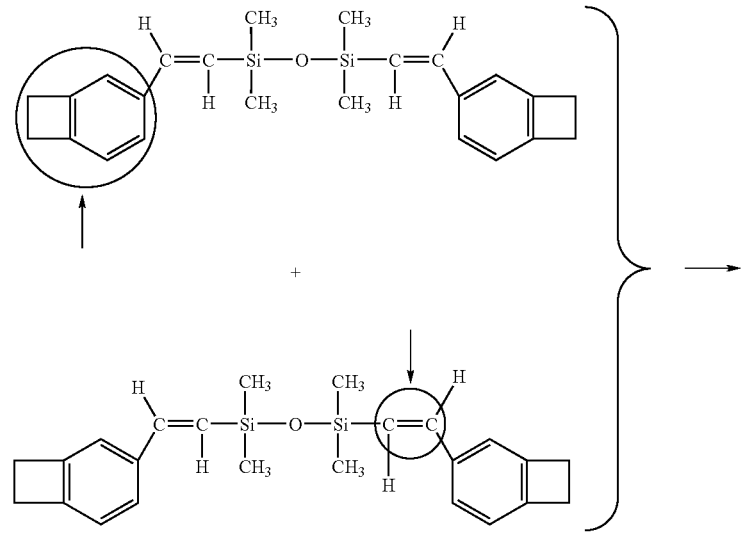

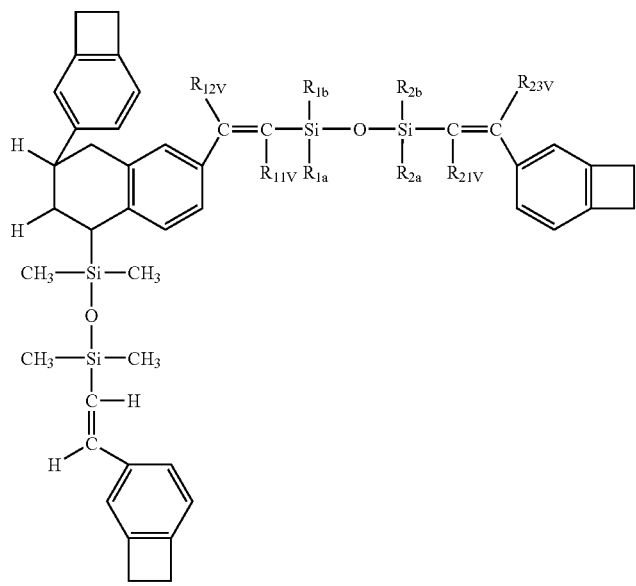

Chemical formula (4): divinylsiloxane-bisbenzocyclobutene Dimer

Inside the dimer of BCB-DVS to be synthesized, 3 unreacted benzocyclobutenes and 3 vinyl groups remain. That is, at least 6 BCB-DVS monomers and the dimer may further undergo addition polymerization. If a mobility of the divinylsiloxane-bisbenzocyclobutene is sufficiently large, then a complex and intricate polymer film where the BSB-DVS are bridged to one another is formed as shown in chemical formula (5).

[Chemical Formula (5)]

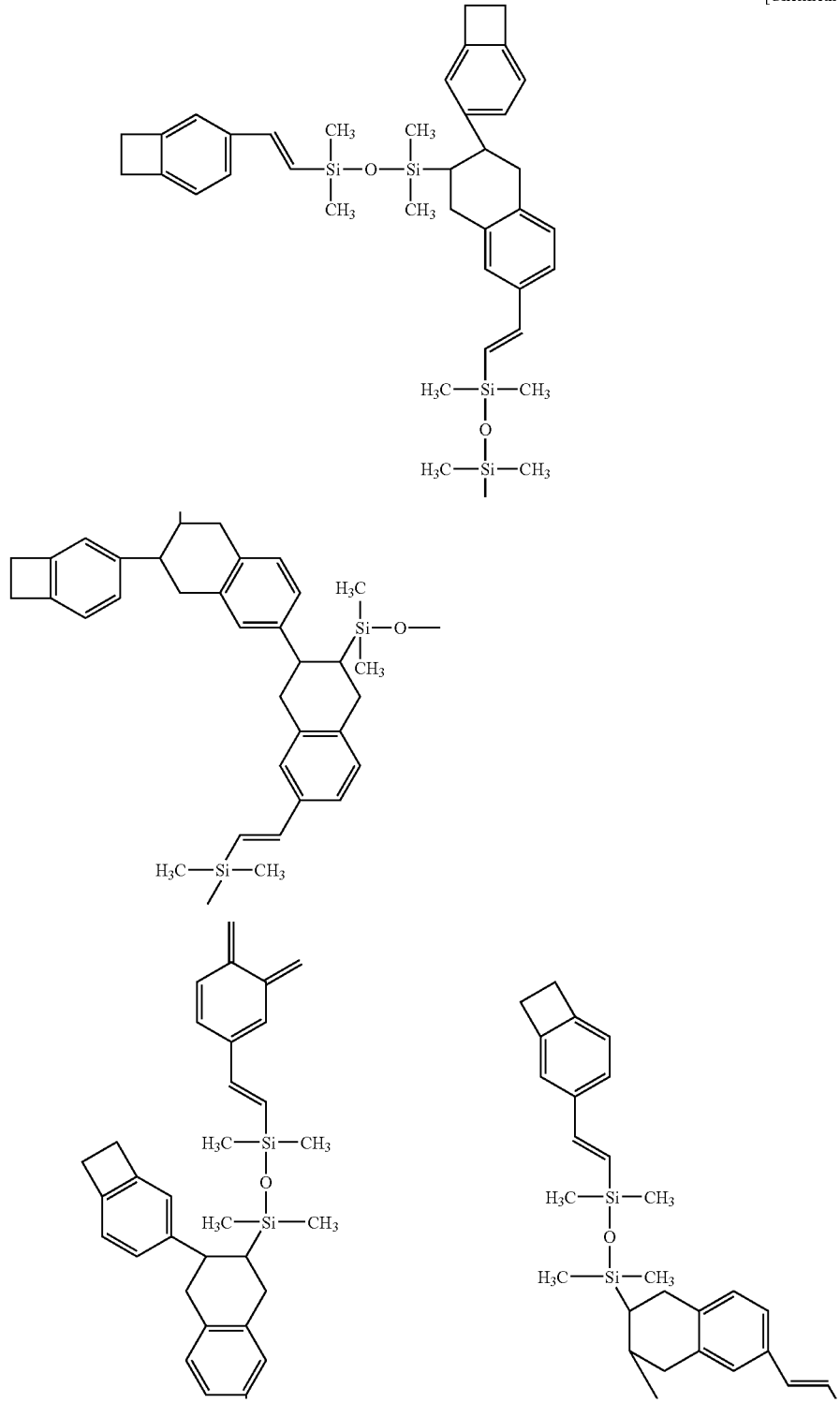

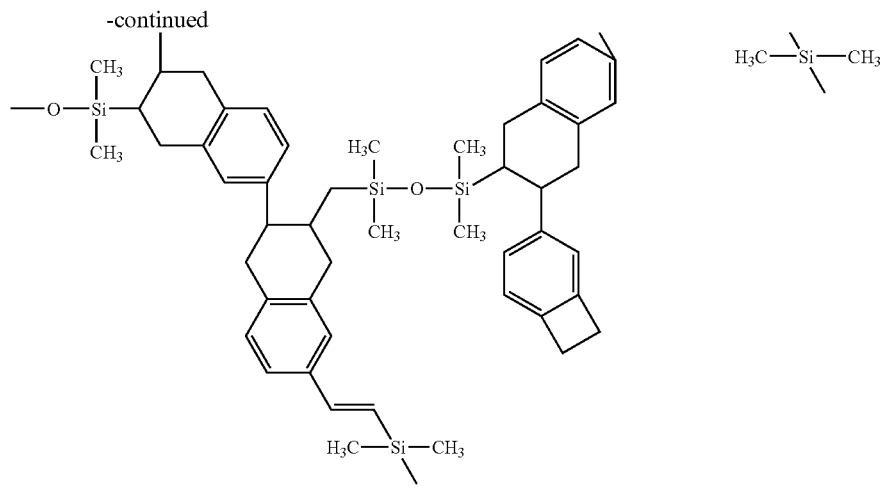

Chemical Formula (5): Organic Polymer Film Synthesized by Addition Polymerization of divinylsiloxane-bisbenzocyclobutene (BSB-DVS)

However, as for the polymer formation by using the spin coating method, a BSB-DVS monomer is being dissolved in a solvent, but, if the monomer concentration increases accompanied by the evaporation of the solvent, the viscosity is increased, and the monomer mobility gets less. In other words, although there are total of 4 sites available for addition polymerization in the BSB-DVS monomer itself, it can only bond to a few BSB-DVD nearby. Because of this, the polymer formation by using the spin coating method cannot attain a sufficient bridge density. Incidentally, there was a problem of deterioration in thermal resistance of the obtained polymer film, and a problem of decline in the film strength. Furthermore, the spin coating method in this case dissolves the organic monomer to a solvent, and the dissolved solid is spin coated. However, the spin coating process has a drawback that the yield of the starting raw material is low because about 90% of the dissolved material is scattered from the substrate. Moreover, the method of heating a spin-coated film in a baking furnace thereby to remove a solvent beforehand, and further heated at high temperature to cause the polymerization reaction of the organic monomer thereby forming an organic polymer film. At this time, when oxygen is present in the baking furnace, the organic polymer film having the desired characteristics is not obtained sometimes by the reaction of oxygen with a portion of the organic monomer. To prevent that from happening, for example, the atmosphere in the whole baking furnace is effectively replaced by a nitrogen gas, however, it is difficult to realize that at a low cost. Furthermore, since the dissolved oxygen in the solvent had sometimes reacted with the organic monomer during baking, a strict atmosphere control is required throughout the whole process, but it is practically difficult to carry out the strict atmosphere control in the spin coating method. Although the spin coating is conducted in a locally evacuated spin coating chamber to prevent scattering of the volatile solvent in the working environment, there is also a risk of contamination of the spin-coated film with floating dust particles or fine particles of the dried organic monomer adhered to the inner wall of the spin coating chamber. In this case, the film quality is deteriorated. Furthermore, the spin coating also has a problem that the environmental burden is large because a large amount of organic solvent is required and the amount of evaporation is also large.

(Second Prior Art)

Japanese unexamined patent publication No, HEI 11-288931 discloses a plasma CVD method using as a raw material a single vaporized gas which is the silicon type hydrocarbon compound where the saturated hydrocarbon is bonded to the straight-chain siloxane (—Si—O—Si—), for obtaining the silicon type organic insulation film with the dielectric constant of 3 or less. By adjusting the FR power or the deposition pressure during the plasma polymerization, although the composition ratio of elements such as carbon, hydrogen, silica and oxygen inside the synthesized organosiloxane film can be controlled, however, the molecular backbone structure of the obtained organosiloxane film or the polymerization structure of the whole film cannot be controlled.

(Third Prior Art)

Published Japanese translations of PCT international publication for patent application No. 2002-503879 (hereinafter referred to as literature 3) discloses a technique to form the organosiloxane film by reacting the oxidized gas eliminated by using a low-powered plasma with the organosilicone compound monomer (organosiloxane monomer) composed of the saturated hydrocarbon group and the siloxane. This reaction process does not have the polymerization selectivity such as activating a specific hydrocarbon group in the organosiloxane monomer and bonding to a specific site and an oxidizing agent gas. Accordingly, when oxidizing the organosiloxane monomer inside the plasma, it was difficult to strictly control its oxidation reaction or its degree of oxidation. In other words, it was difficult to design molecules of porous film by inducing minute pores to the silicone type organic insulation film. Furthermore, in order to improve the deposition property of the silicone organic insulation film synthesized as the lower and upper layers, it was necessary to control the composition of organosiloxane film near to the interface. According to the disclosed organosiloxane film formation method, it does not have the means for controlling the molecular structure or the chemical composition of the intermediate layer or the composition near to the interface. The present inventors have developed the technology to form the organosiloxane film on the substrate surface by vaporizing the organosiloxane monomer including an unsaturated hydrocarbon group, transporting it through the vapor using a carrier gas, and spraying to the heated substrate surface via the He plasma formed in the reaction chamber. This relating technology is disclosed in Japanese unexamined patent publication No. HEI 2000-12532. According to this organosiloxane film formation method, a vapor-transported organoxiloxane monomer generates the polymerization reaction on the substrate surface, and the organosiloxane film is formed. For example, if divinylsiloxane-bisbenzocyclobutene (BCB-DVS) monomer is utilized shown in chemical formula (1), having the straight-chain organosiloxane as backbone, its plasma polymerization reaction process is assumed to coincide approximately to the thermal polymerization reaction, and the cyclobutene group and the vinyl group which are the unsaturated hydrocarbon groups included in the organosiloxene are selectively activated, and the organosiloxane film having an intricate bridge structure shown in the chemical formula (5) is obtained, by the polymerization reaction via the elementary reaction processes shown in the chemical formulae (2) to (4).

The key point of this technology is in the fact that the unsaturated hydrocarbon group such as cyclobutene group or vinyl group is included in the organosiloxene monomer used as a raw material, and the organosiloxene monomers are bonded in a network shape via these unsaturated hydrocarbon groups. In other words, by controlling the position of the unsaturated hydrocarbon groups taking part in the polymerization reaction, the position of the polymerization reaction is specified, and a network structure of the desired organosiloxane film with organosiloxane monomer backbone is formed. Since the organosiloxane monomer supplied as a vapor is in high vacuum, in comparison to the spin coating method, its mobility is large on the surface, and the film strength and the thermal resistance of the obtained organosiloxane film are increased by improving the bridge density of the network structure. For example, as for the organosiloxane film obtained from the BCB-DVS monomer by the plasma polymerization, it has a highly dense bridge structure of the straight-chain siloxanes via the unsaturated hydrocarbon, and its dielectric constant is ranging from 2.5 to 2.7.

Particularly, in the case of using it as the interlayer insulation film of the multi-layered wiring of ULSI, the organosiloxane film structure is formed in between the upper wiring layer and lower electrode layer. At this time, other insulation film is used in the production of the lower electrode layer and the upper wiring layer. Accordingly, the organosiloxene film of the interlayer insulation film is of a laminated structure with the organic or inorganic insulation film of the upper layer and lower layer. Because of this, it is necessary that the film strength and the deposition property of the insulation film at the interface contacting the upper plane or the lower plane of the organosiloxane film to be high. To improve the film strength near to the interface or the deposition property of the organosiloxane film, it is effective to increase its bridge density but that accompanies the increase in the dielectric constant.

Ideally, the organosiloxene film utilized as the interlayer insulation film, has a high strength film quality and a high bridge density which is excellent in the deposition property only near to the interface with other film material. Other section of the interlayer other than the interface ideally has a film configuration that keeps a bridge density that can attain the appropriate dielectric constant. However, as for the plasma polymerization film utilizing the single organosiloxene monomer as the raw material, it was generally difficult to arbitrarily select the bridge density of the obtained polymer film in the film thickness direction to make the polymer film with the continuously changing deposition property and dielectric constant. That is, in the plasma polymer film using the conventional single raw material, it was impossible to arbitrarily control the bridge density for controlling the film quality to a large extent and continuously in the film thickness direction.

DISCLOSURE OF INVENTION

The present invention solves the previously mentioned problems. Accordingly, an objective of the present invention is to provide a new organosiloxane polymer film capable of arbitrarily controlling a film structure section keeping a bridge density that can attain an appropriate dielectric constant, and a section indicating the high strength film quality and the high bridge density that is excellent in the deposition property, capable of changing the bridge structure inside the film continuously and yet to a large extent, in the film thickness direction, and which is suitable for use as the insulation interlayer film.

Furthermore, an another objective of the present invention is to provide a production method of the new organosiloxane polymer film capable of arbitrarily controlling a film structure region section keeping a bridge density that can attain an appropriate dielectric constant, and a section indicating the high strength film quality and the high bridge density that is excellent in the deposition property, capable of changing the bridge structure inside the film continuously and yet to a large extent, in the film thickness direction, and which is suitable for use as the insulation interlayer film.

In more specific terms, the aim of the present invention is to provide an organosiloxane polymer film that selected 2 or more organosiloxane raw materials for readily achieving the capability of arbitrarily controlling a film structure section keeping a bridge density that can attain the appropriate dielectric constant, and a section indicating the high strength film quality and the the high bridge density which is excellent in the deposition property, capable of changing the bridge structure inside the film continuously and yet to a large extent, in the film thickness direction, when providing the organosiloxane copolymer film by the plasma polymerization method using 2 or more organosiloxane raw materials.

Furthermore, the aim of the present invention is to provide a production method of the organosiloxane polymer film that selected 2 or more organosiloxane raw materials, for readily achieving the capability of arbitrarily controlling a film structure section keeping a bridge density that can attain the appropriate dielectric constant, and a section indicating high strength film quality and the high bridge density that is excellent in the deposition property, capable of changing the bridge structure inside the film continuously and yet to a large extent, in the film thickness direction, when providing the organosiloxane copolymer film by the plasma polymerization method using 2 or more organosiloxane raw materials.

Furthermore, the aim of the present invention is to provide a production apparatus of the organosiloxane polymer film that selected 2 or more organosiloxane raw materials for readily achieving the capability of arbitrarily controlling a film structure section keeping a bridge density that can attain the appropriate dielectric constant, and a section indicating the high strength film quality and the high bridge density that is excellent in the deposition property, capable of changing the bridge structure inside the film continuously and yet to a large extent, in the film thickness direction, when providing the organosiloxane copolymer film by the plasma polymerization method using 2 or more organosiloxane raw materials.

Furthermore, the aim of the present invention is to provide a semiconductor device which utilizes the organosiloxane polymer film as the interlayer insulation film that selected 2 or more organosiloxane raw materials, for readily achieving the capability of arbitrarily controlling a film structure section keeping a bridge density that can attain the appropriate dielectric constant, and a section indicating high strength film quality and the high bridge density that is excellent in the deposition property, capable of changing the bridge structure inside the film continuously and yet to a large extent, in the film thickness direction, when providing the organosiloxane copolymer film by the plasma polymerization method using 2 or more organosiloxane raw materials.

The inventors found that the polymer film that utilized only the organosiloxane with straight-chain siloxane as raw materials for the plasma polymerization attains a high bridge density, a high strength film quality, a high surface density of siloxane structure, and an excellence in the deposition property to the other material film. Furthermore, the inventors recognized that the copolymer film is formed which maintains the cyclosiloxane structure by implementing the plasma polymerization adding the organosiloxane with straight-chain siloxane backbone is added to the organosiloxane with cyclosiloxane backbone, accompanied by an increase in the ratio of the organosiloxane with cyclosiloxane backbone, accompanied by a decrease in the average density of the film, and accompanied by the fact of attaining a reduction in the dielectric constant. In addition to the acquired knowledge, the inventors recognized that since the organosiloxane with cyclosiloxane backbone and the organosiloxane with straight-chain siloxane backbone are vaporized and supplied as vapors, therefore, their ratio can continuously be changed, as well as the quality of the obtained copolymer film can continuously be changed. The inventors completed the present invention accordingly.

In other words, the organosiloxane copolymer film according to the present invention, wherein the organosiloxane copolymer film with plural kinds of organosiloxanes as the configuration units, wherein the plural kinds of organosiloxanes derived configuration units include at least a first organosiloxane with cyclosiloxane backbone, and a second organosilxoane with straight-chain siloxane backbone, wherein the organosiloxane copolymer film forms a bridge structure by bonding a plurality of the second organosiloxanes to the first organosiloxane. At this time, the organosiloxane copolymer film preferably has a film configuration thereby a content ratio of the first organosiloxane with cyclosiloxane backbone derived unit and the second organosiloxane with straight-chain siloxane backbone derived unit is changing, in the thickness direction.

Furthermore, the organosilxoane copolymer film configures a formation whereby the upper and lower planes in the thickness direction are both contacting the inorganic insulation films. The organosiloxane copolymer film having a content ratio of the first organosiloxane derived unit and the second organosiloxane derived unit, wherein the second organosiloxane with straight-chain siloxane backbone derived unit is the main component, near to the interface with the inorganic insulation film of the upper and lower planes, and wherein the content ratio with the second organosiloxane derived unit is lower than that of the interface at the film inner section. The density near to the interface is larger than the density in the film inner section.

In addition to that, the present invention provides a semiconductor device invention as the preferred usage of the previously-described organosiloxane copolymer film. In other words, the semiconductor device according to the present invention is a semiconductor device utilizing the organosiloxane film as the interlayer insulation film, wherein the organosiloxane film is an organosiloxane copolymer film having the plural kinds of organosiloxanes as configuration units, wherein the organosiloxane film includes at least including a first organosiloxane with cyclosiloxane backbone and a second organosiloxane with straight-chain backbone, thereby forming a bridge structure by bonding the plurality of second organosiloxanes to the first organosiloxane, wherein the organosiloxane copolymer film is sandwiched by the inorganic insulation films. The content ratio of the first organosiloxane derived unit and the second organosiloxane derived unit near to the interfaces, of the inorganic insulation films at the upper and lower planes, the main component is the second organosiloxane with straight-chain backbone derived unit, and the content ratio with the second organosiloxane derived unit is lower than that of the interface at an film inner section. A density near to the interface is larger than a density at the film inner section. The organosiloxane copolymer film forms a wiring layer embedding a copper film therein.

Now, the present invention further provides the production method suitable in producing the previously-described organosiloxane copolymer film according to the present invention. In other words, a vapor deposition method of the organosiloxane copolymer film of the present invention is a method of growing the organosiloxane copolymer film on the substrate surface, having the plural kinds of organosiloxanes as configuration units. The organosiloxane copolymer film at least includes a first organosiloxane with cyclosiloxane backbone and a second organosiloxane with straight-chain siloxane backbone as the plural kinds of organosiloxane configuration units. The copolymer film is forming a bridge structure by bonding a plurality of the second organosiloxanes to the first organosiloxane. The copolymer film at least has a step of vaporizing a first organosiloxane monomer with cyclosiloxane backbone, a step of vaporizing a second organosiloxane monomer with straight-chain siloxane backbone, a step of supplying the vaporized first organosiloxane monomer gas at the pre-determined supply rate, a step of supplying the vaporized second organosiloxane monomer gas at the pre-determined supply rate, a step of mixing the supplied first organosiloxane monomer gas and the supplied second organosiloxane monomer gas to form a mixed gas, a step of inducing the mixed gas to a depressurized reaction chamber, and a step of spraying onto the heated substrate after passing the mixed gas induced through the plasma atmosphere formed in the reaction chamber. The vapor deposition method of the organosiloxane copolymer film grows a copolymer film forming a bridge structure by reacting first organosiloxane monomer and the second organosiloxane monomer in the mixed gas sprayed on the substrate, and by bonding the plurality of second organosiloxanes to the first organosiloxane.

At this time, the supply rate of the first organosiloxane monomer gas and the supply rate of the second organosiloxane monomer gas are respectively changed so as to change their supply rate ratio. Accompanied by the change in supply rate ratio, the film configuration preferably has a changing content ratios of the first organosiloxane with cyclosiloxane backbone derived unit and the second organosiloxane with straight-chain siloxane backbone derived unit, in the thickness direction.

On the other hand, an apparatus suitable for implementing the vapor deposition method of the organosiloxane copolymer film according to the present invention is also provided. In other words, the vapor deposition apparatus for the organosiloxane copolymer film according to the present invention is a vapor deposition apparatus of the organosiloxane copolymer film having the plural kinds of organosiloxanes as configuration units, at least comprises: monomer gas supplying units for controlling the supply amounts of the plural kinds of organosiloxane monomer gases and supplying them separately; a cleaning gas supplying unit; a mechanism for forming a mixed gas by mixing the monomer gases supplied from the monomer gas supplying units and a cleaning gas supplied from the cleaning gas supplying unit as required; a reaction chamber equipping a substrate heating section capable of loading a substrate, and a shower head capable of spraying the mixed gas uniformly to a substrate plane loaded on the substrate heating section; a RF power supply connected to the shower head for applying the RF voltage to the shower head, in respect to the earthed substrate heating section; and an exhaust apparatus for depressurizing inside the reaction chamber; wherein the monomer gas supplying units at least is provided with a first monomer supplying unit for vaporizing and supplying the first organosiloxane with cyclosiloxane backbone, and a second monomer supplying unit for vaporizing and supplying the second organosiloxane with straight-chain siloxane backbone.

BEST MODE TO CARRYING OUT THE INVENTION

Hereunder, the present invention shall be described in detail.

The organosiloxane copolymer film of the present invention has plural kinds of organosiloxanes as configuration units. The configuration units derived from plural kinds of organosiloxanes, includes at least a first organosiloxane with cyclosiloxane backbone and a second organosiloxane with straight-chain siloxane backbone. The first organosiloxane with cyclosiloxane backbone uses a structure which is substituted by unsaturated hydrocarbon groups, capable of addition polymerization reaction, as the cyclosiloxane backbone. On the other hand, the second organosiloxane with straight-chain siloxane backbone uses a structure which is substituted by at least more than 2 unsaturated hydrocarbon, capable of addition polymerization reaction, as the straight-chain siloxane backbone.

Figure 1:
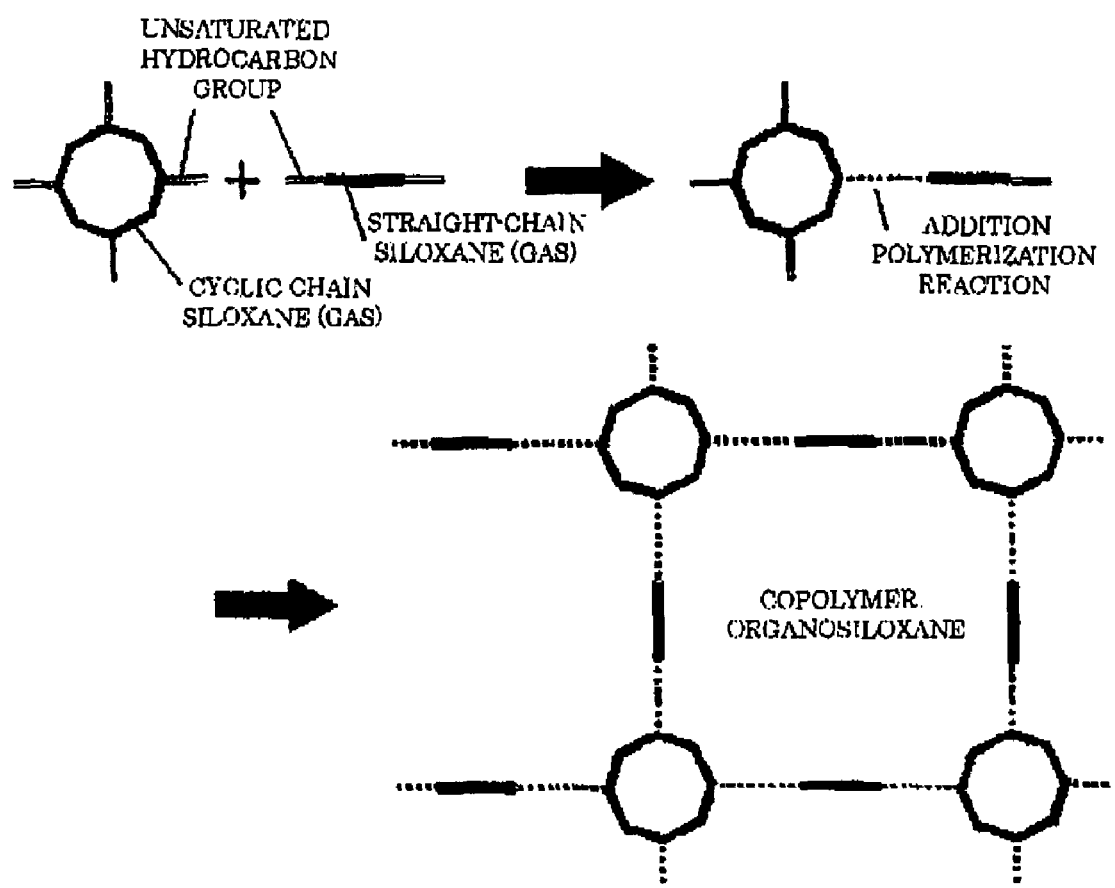
FIG. 1 is a schematic drawing showing an addition polymerization reaction processing of the first organosiloxane with cyclosiloxane backbone and the second organosiloxane with straight-chain siloxane backbone for configuring the organosiloxane copolymer film of the present invention, and one example of the network structure formation processing inside the copolymer film.

FIG. 1 shows an addition polymerization reaction processing of the first organosiloxane with cyclosiloxane backbone and the second organosiloxane with straight-chain siloxane backbone for configuring the organosiloxane copolymer film, and one example of the network structure formation processing inside the copolymer film. As schematically shown in FIG. 1, the addition polymerization reaction is carried out to the first organosiloxane and the second organosiloxane. For every one of the first organosiloxane with cyclosiloxane backbone, the second organosiloxane with straight-chain siloxane backbone not only react in plural numbers but also forms a copolymer with the first organosiloxane with cyclosiloxane backbone since it possess more than 2 unsaturated hydrocarbon groups, by connecting between two of the first organosiloxane with cyclosiloxane backbone. At this time, the bridge structure is formed by a plurality of second organosiloxanes with straight-chain siloxane backbone reacting to a single first organosiloxane with cyclosiloxane backbone. The copolymer film as a whole can configure a bridge structure that is stretched in a network shape.

Figure 2:
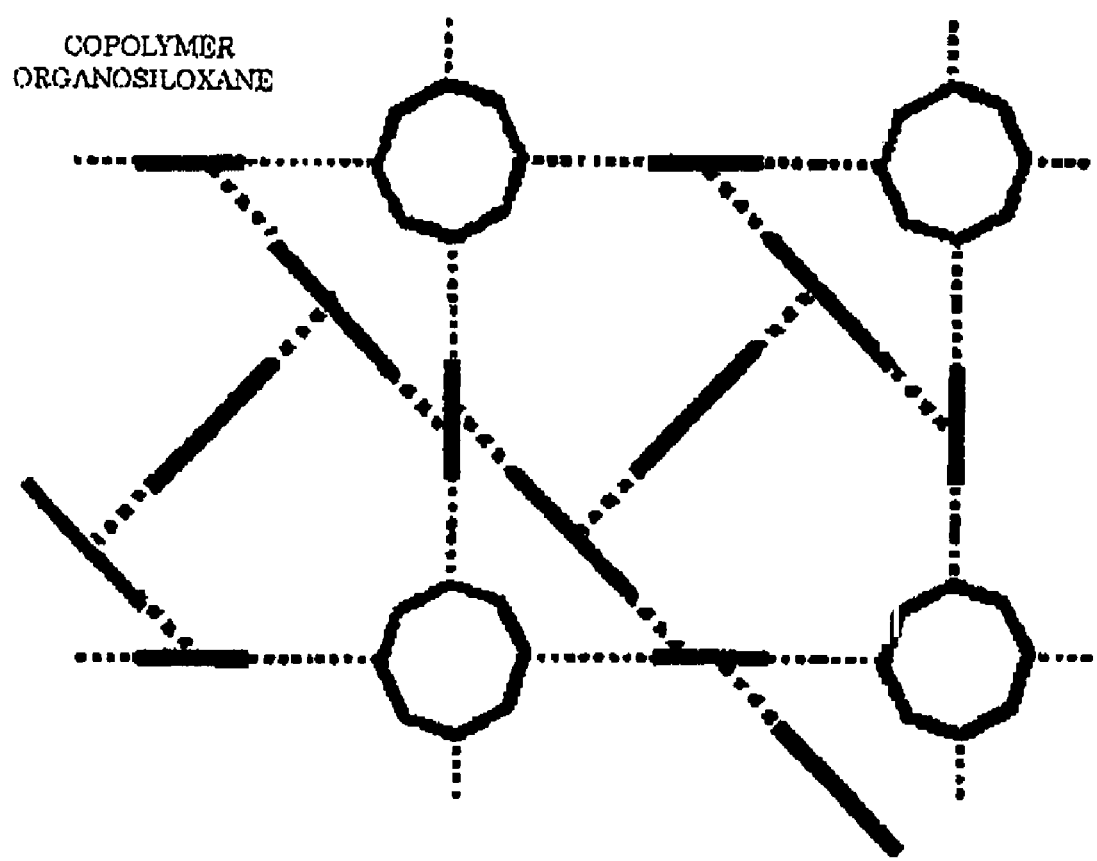
FIG. 2 is a schematic drawing showing one example of a straight-chain siloxane derived bridge structure, added to the network structure of the copolymer film, upon increasing the content ratio of the second siloxane with straight-chain siloxane backbone against the first organosiloxane with cyclosiloxane backbone, and a high density of the whole copolymer film, for the organosiloxane copolymer film according to the present invention.

In addition to that, the bridge structure can be formed from just the second organosiloxane with straight-chain siloxane backbone. That is, a structure of at least 3 substituted unsaturated hydrocarbon groups and more, capable of addition polymerization reaction is used as the straight-chain siloxane backbone, then the bridge formation is possible further by the addition polymerization of the second organosiloxane in between the second organosiloxane with straight-chain siloxane backbone connecting the two first organosiloxane with cyclosiloxane backbone. FIG. 2 shows one example of a straight-chain siloxane derived bridge structure, added to the network structure of the copolymer film, upon increasing the content ratio of the second siloxane with straight-chain siloxane backbone against the first organosiloxane with cyclosiloxane backbone, and a high density of the whole copolymer film, for the organosiloxane copolymer film. In other words, as schematically illustrated in FIG. 2, in addition to the large network shape bridge structure centering the first organosiloxane with cyclosiloxane backbone, an intricate bridge structure between the second organosiloxane with straight-chain siloxane backbone is further attached, so that the whole network structure is markedly intricate.

In other words, if the content ratio of the second organosiloxane with straight-chain siloxane backbone increases, the obtained copolymer film becomes high in the bridge density, has a high-strength film quality, and has an excellent deposition property. On the other hand, if the content ratio of the second organoxiloxane with straight-chain siloxane backbone is relatively low, the bridge density gets relatively low, and moreover, the siloxane unit contained per unit volume is relatively suppressed, as a result, the dielectric constant itself is kept low. In addition to that, the pores derived from the cyclosiloxane backbone have a role of suppressing an elevation of the bulk density, which contributes to reduction in the dielectric constant. Now, the size of pores derived from the cyclosiloxane backbone is dependent on the number of membered rings of the cyclosiloxane. In addition to that, the ratio of unit numbers derived from the first organosiloxane with cyclosiluxane backbone and the second organosiloxane with straight-chain siloxane backbone are dependent on the supply ratios from a vapor phase to the substrate surface. Being dependent on the mixture ratio inside the mixed gas, the film quality of the obtained copolymer film can continuously be changed by changing the mixture ratio inside the mixed gas during its growth.

The content ratio of straight-chain siloxane unit and cyclosiloxane unit in the copolymer film is, for example, can be evaluated, based on a relative ratio of both infrared ray adsorption intensities, using a difference in the molecular vibration caused by the straight-chain siloxane backbone and the cyclosiloxane backbone. In specific terms, a frequency derived from a stretch motion of the 4-membered cyclosiloxane is 1085 $cm^{-1}$, a frequency derived from the stretch motion of the 3-membered cyclosiloxane is 1015 $cm^{-1}$, on the other hand, a frequency derived from the stretch motion of the straight-chain siloxane is 1055 $cm^{-1}$. Their adsorption peaks are classifiable and detectable by using the FT-IR method.

The first organosiloxane with cyclosiloxane backbone which is used in a configuration of the organosiloxane copolymer film according to the present invention, it has at least 2 or more sites where the addition polymerization reaction is possible for configuring the copolymer, and furthermore, preferably it has at least 3 or more sites where the addition polymerization reaction is possible for configuring the large network bridge structure as its core. On the other hand, the second organosiloxane with straight-chain siloxane backbone has at least 2 or more sites where the addition polymerization reaction is possible for configuring the copolymer, and furthermore, preferably it has at least 3 or more sites where the addition polymerization reaction is possible for configuring an intricate bridge structure of the second organosiloxane with straight-chain siloxane backbone interconnections.

Figure 3:
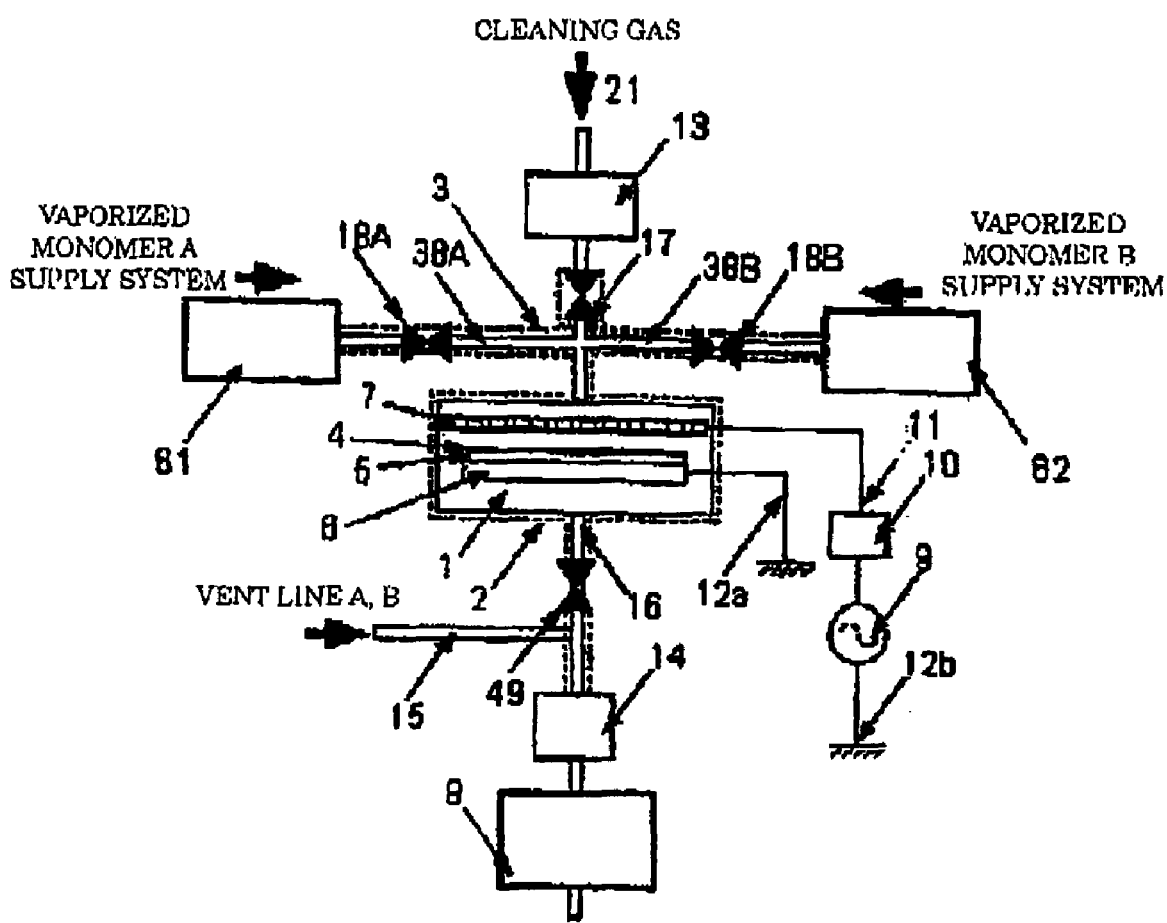
FIG. 3 is a schematic drawing showing a configuration example of a vapor deposition apparatus utilizing the plasma excitation mechanism, equipping two kinds of independent organosiloxane monomer vapor supplying systems, utilized in the production of organosiloxane copolymer film according to the present invention.

Hereinbelow, the process of forming the organoxiloxane copolymer film according to the present invention as described above and the apparatus utilized in its growth shall be explained. FIG. 3 shows a configuration example of a vapor deposition apparatus utilizing the plasma excitation mechanism, equipping two kinds of independent organosiloxane monomer vapor supplying systems, utilized in the production of the organosiloxane copolymer film.

First of all, a reaction chamber 1 is depressurized by a vacuum pump 8, a substrate heating section 6 is prepared inside the reaction chamber 1, and a semiconductor substrate 5 is fixed on top of it. The first organosiloxane monomer (organic monomer A) and the second organoxiloxane monomer (organic monomer B) are in vaporized states inside the vaporized supplying systems 61 and 62, respectively. The monomers are supplied and mixed immediately before the reaction chamber 1, via the raw material supply pipings 38A and 38B, and via valves 18A and 18B, together with a carrier gas. After mixing the two, it is guided to the reaction chamber 1. Being vaporized at the vaporized supply systems 61 and 62, the first organosiloxane monomer 22A and the second organoxiloxane monomer 22B that are diluted by the carrier gas, respectively, and they are supplied to a shower head 7, at the same time, supplied to the reaction chamber 1 through the vaporized raw material supply piping 49 equipped with a heater 3 for maintaining the piping temperature. The vaporized and diluted monomers are dispersed and sprayed on a substrate surface of the semiconductor substrate 5 at the uniformly mixed state. At this time, a RF power was applied to the shower head 7, thereby to generate a plasma between the space of the substrate heating section 6 and the shower head 7. The first organosiloxane monomer (organic monomer A) and the second organosiloxane monomer (organic monomer B) pass through the plasma. By the excitation energy derived from the plasma, and by a thermal energy supplied from the substrate heating section 6, the copolymerization reaction of the first organosiloxane monomer 22A and the second organoxiloxane monomer 22B is generated, and the organosiloxane copolymer film 4 is grown on the surface of the semiconductor substrate 5.

Now, the unreacted raw material monomer heats an inner wall of the reaction chamber 1 and the vacuum pump 8 keeps the reduced pressure inside the reaction chamber 1. This way, without causing cohesion on the inner wall of the reaction chamber 1, the unreacted monomer as a vapor reaches to a cooling trap 14 via the exhaust gas piping 16 heated by a heater. Inside the cooling trap 14, the first organosiloxane monomer and the second organosiloxane monomer are both cooled, as a result, their vapor pressures exceed the saturated vapor pressure, and are liquefied or solidified in the cooling trap 14. In the cooling trap 14, as a result of effective elimination and recycling, the unnecessary organosiloxane monomer reaching a lower flow of the exhaust pump 8 is prevented from happening. Besides, a vapor flow controller 13 and a valve 17 are prepared to supply a cleaning gas 21 for cleaning the reaction chamber 1

Figure 4:
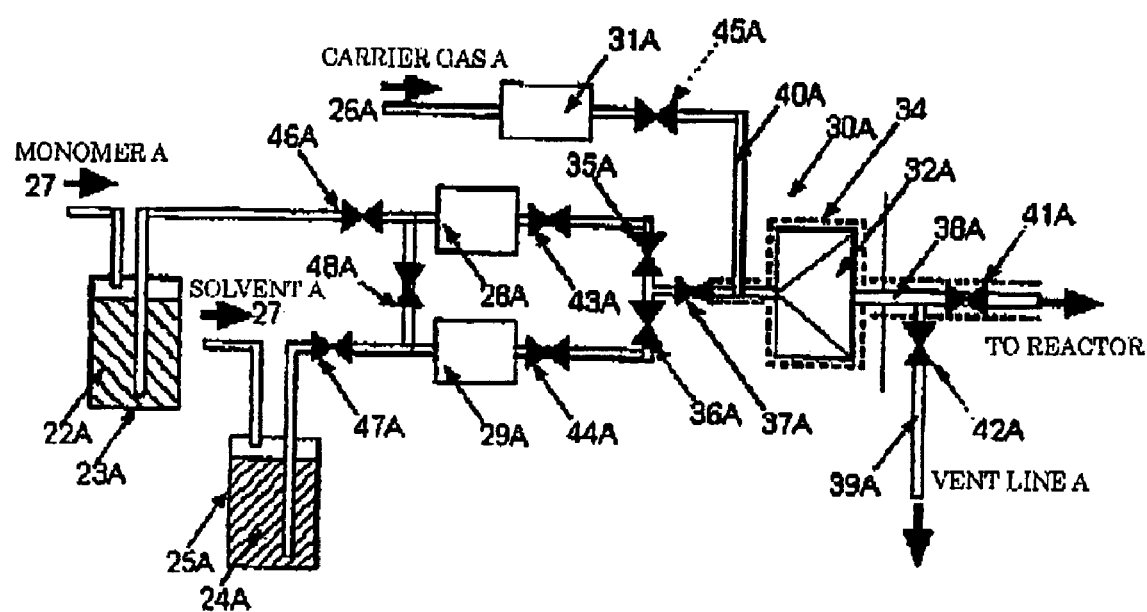
FIG. 4 is a schematic drawing showing a configuration of vaporization controller using the liquid flow control mechanism applicable to vaporizing and supplying the liquid organosiloxane monomer at the room temperature.

FIG. 4 shows schematically one example of the organosiloxane monomer raw material supplying system applicable to its vaporizing and supplying in the case of the first organosiloxane monomer, and the second organosiloxane monomer used in the present invention are liquid at the room temperature. The system shown in FIG. 4 illustrates the process of vaporized monomer at a vaporization controller, and the supplying process immediately before the reaction chamber. First, the first organic monomer A22 as liquefied is supplied from the first organosiloxane monomer tank 23A to a vaporization controller A 30A, via a valve 46, a liquid flow indicator A28A, and a valve 43. At this time, it is supplied to a vaporization controller A 30A via a vaporization control valve A 35A and a valve 37 inside a vaporization controller A, which is feedback controlled from the first organosiloxane monomer liquid flow indicator 28A. On the other hand, a carrier gas A 26A is supplied to the vaporization controller 30A through a valve 45A. Henceforth, immediately before a vaporization chamber A 32A, the first organosiloxane monomer 22A which is a liquid and a carrier gas A 26A are mixed. In a mixed state with the carrier gas A, the liquid raw material monomer A 22A supplied to the vaporization chamber A 32A receives a sudden pressure decline upon being supplied to the vaporization chamber 32A, at the same time, it is continuously vaporized due to a thermal energy being supplied by a heater 34A. The vaporized first organosiloxane monomer is supplied to the reaction chamber 1 via the raw material supply piping 38A and a valve 18A. As for the second organosiloxane monomer, likewise, in the case of being liquid at the room temperature, a various organosiloxane monomer raw material supplying systems can be used.

Figure 5:
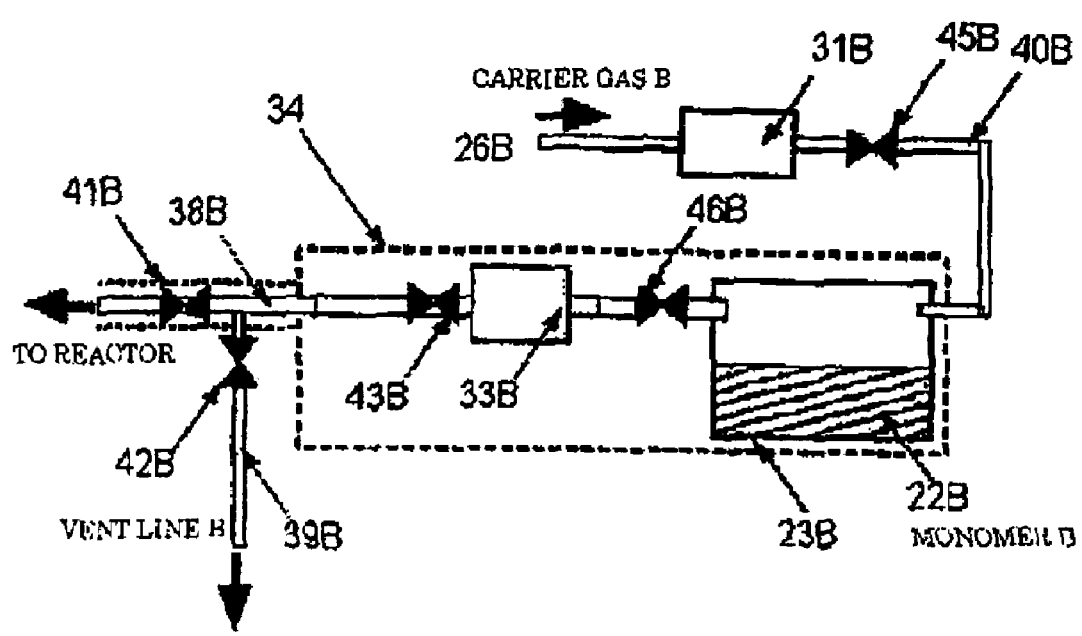
FIG. 5 is a schematic drawing showing a configuration of vaporization supplying system applicable to vaporizing and supplying the solid organosiloxane monomer at the room temperature, by using the vaporization controller and the vaporization flow control mechanism.

FIG. 5 shows schematically one example of the organosiloxane monomer raw mateial supplying system applicable to its vaporizing and supplying, in the case of the first organosiloxane monomer and the second organosiloxane monomer utilized in the present invention are solid at the room temperature. The system shown in FIG. 5 indicates the process from a vaporization process inside the organosiloxane monomer tank 23B to the supplying process immediately before the reaction chamber 1. A flow amount of a carrier gas B 26B is controlled in the vapor flow controller 31B, and supplied to an organic monomer B tank B23B via a valve 45B. At this time, the organosiloxane monomer B tank 231B is heated to a certain temperature. The heating temperature is selected to the temperature for obtaining a sufficient saturted vapor pressure by vaporizing the organic monomer B from the melt state, alternatively, by sublimating from the solid state. At this time, the carrier gas B 26B becomes a state of including the vaporized organosiloxane monomer B at the saturated vapor pressure. After that, if the temperature is decreased, cohesion of the organic monomer B included occurs, and beyond the valve 46B, the vapor flow indicator B 33B and a valve 43B are heated to the same temperature and more, and are controlled to maintain the sublimation state or the vaporized state. The carrier gas is supplied, and then the vaporized organosiloxane monomer B is supplied to the raw material supply piping 38B via the valve 46B, the vapor flow indicator B 33B, and a valve 433. Then, it is supplied to the reaction chamber 1 via the valve 41B.

As described above, by selecting an appropriate supplying system, regardless of the organosiloxane monomer raw material being a liquid or a solid at the room temperature, the organosiloane monomer under the vaporized state can be supplied to the reaction chamber at the desired supply ratio. Now, in the case of using the organosiloxane monomer gas at the room temperature, beforehand, after diluting with the carrier gas, the supply amount is controlled by the gas flow controller. At this time, to avoid the temperature decline of the mixed gas upon mixing with other organosiloxane monomer, the raw material supply piping 36B is desirably heated by a heater 3. Moreover, as a carrier gas utilized in the present invention is appropriately and ideally an inert gas such as helium gas, argon gas, and neon gas, in respect to the organosiloxane monomer. Moreover, the ideal carrier gas as such is ideally a gas that contributes to the maintenance of the plasma generated inside the reaction chamber 1.

In other words, the organosiloxane monomers inherent an unsaturated hydrocarbon group as a site capable of the addition polymerization reaction, wherein the unsaturated hydrocarbon group is activated by the collision of low energy electron inside the plasma, and the organosiloxane copolymer film having the uniform inner plane distribution of the cyclosiloxane and the straight-chain siloxane is grown by spraying to the heated substrate, and by the addition polymerization between the unsaturated hydrocarbon groups while swiftly moving the substrate surface. In more specific terms, even in the case of possessing a difference which is significant to a reactivity of the thermal addition polymerization reaction of the unsaturated hydrocarbon group, since it is activated beforehand, the composition control of the obtained copolymer film is effectively carried out accompanied by a change in the supply ratio.

Henceforth, the organosiloxane copolymer film according to the present invention, by using the previously described characteristics, the film configuration where the content ratio of the unit derived from first organosiloxane with cyclosiloxane backbone and the unit derived from second orgnosiloxane with straight-chain siloxane backbone is changing in the film thickness direction can be readily produced. For example, when applying it as an insulation film used in producing semiconductor device, at the upper and lower planes of the films, in the case of making the layered structure by preparing other inorganic insulating films, the composition of the copolymer film sandwiched between the inorganic insulating films at the interfaces near to the inorganic insulating films contains much units derived from the second organosiloxane with straight-chain siloxane backbone as the main component, so that the deposition property is enriched, and a high bridge density can bring about the composition indicating a high strength. On the other hand, the composition inside the film contains a relatively high ratio of the unit derived from the first organosiloxane with cyclosiloxane backbone, so that the density per volume is relatively low, capable of suppressing the dielectric constant low. As a result of this, the interfaces near to the inorganic insulating films have the high density, and although the dielectric constant is relatively higher, as the whole copolymer film on average, which is worked out by taking an average with the interfaces and the film inner section, the effective dielectric constant can be low.

To make a good use of this advantage, the wiring layer embedding a copper film is prepared inside the copolymer film of the present invention, and since the dielectric constant of the copolymer film in between is suppressed low, the parasitic capacitance between wirings can be controlled. In other words, according to the semiconductor device of the present invention, to make a layered structure by preparing other inorganic insulating film at the upper and lower planes of the films, the deposition property at the interfaces with the inorganic insulating films is set high, on the other hand, as the whole film, the effective dielectric constant is set low. This way, the structure that prepares the wiring layer embedding the copper film in the copolymer film is achieved, and the parasitic capacitance of the wiring layer is suppressed.

EMBODIMENTS

Hereunder, the embodiments of the present invention shall be explained in more detail. The embodiment according to the present invention is only one example, and should not be limited to the specific example described in the present invention.

First Embodiment

The organosiloxane copolymer film according to the present invention comprises a 4-membered cyclosiloxane composed of 4 silicon atoms and 4 oxygen atoms shown in general formula (6) below, as one of the raw materials, and as one embodiment of the first organosiloxane monomer with cyclosiloxane backbone.

[General Formula (6)]

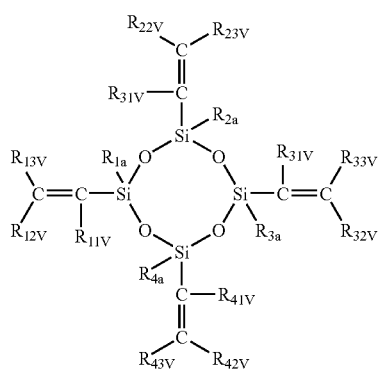

General Formula (6): 4-Membered Cyclosiloxane Having a Plurality of Unsaturated Hydrocarbon Groups.

In this formula, R11V, R12V, R13V, R1a, R21V, R22V, R23V, R2a, R31V, R32V, R33V, R3a, R41V, R42V, R43V, and R4a denote hydrocarbon groups, phenyl groups or hydrogen. Specifically, tetramethylvinyl-tetramethyl-cyclotetrasiloxane (TMVTMCTS) of chemical formula (7), tetravinyl-tetramethyl-cyclotetrasiloxane (TVTMCTS) of chemical formula (8), tetramethylvinyl-tetrahydro-cyclotetrasiloxane (TMVTHCTS) of chemical formula (9), and tetravinyl-tetrahydro-cyclotetrasiloxane (TVTHCTS) of chemical formula (10) are included in one of the examples of the first organosiloxane with cyclosiloxane backbone, as shown in the general formula (6).

[General Formula (7)]

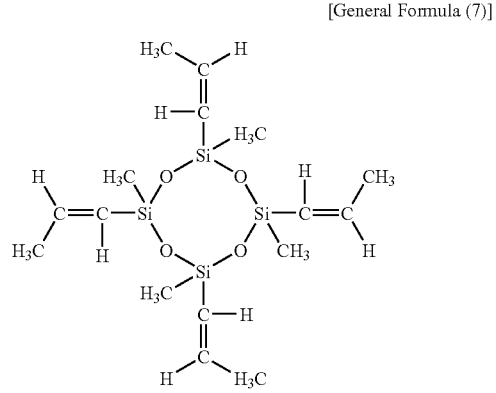

Chemical Formula (7): tetramethylvinyl-tetramethyl-cyclotetrasiloxane (TMVTMCTS)

[General Formula (8)]

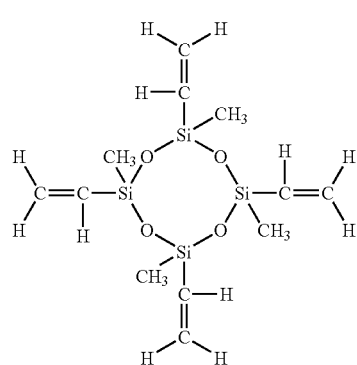

Chemical Formula (8): tetravinyl-tetramethyl-cyclotetrasiloxane

[General Formula (9)]

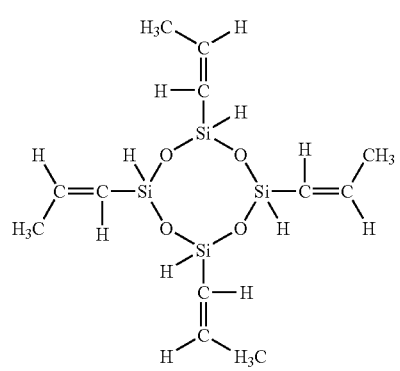

Chemical Formula (9): tetramethylvinyl-tetrahydro-cyclotetrasiloxane (TMVTHCTS)

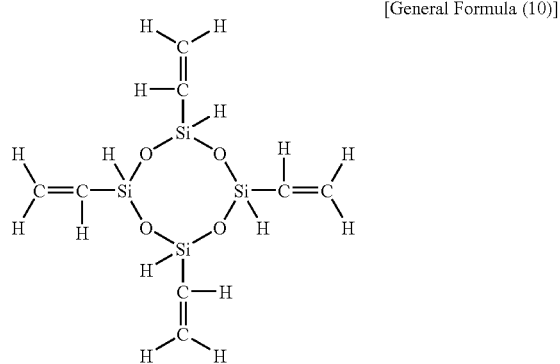

[General Formula (10)]

Chemical Formula (10): tetravinyl-tetrahydro-cyclotetrasiloxane (TVTHCTS)

Furthermore, the organosiloxane copolymer film according to the present invention uses 3-membered cyclosiloxane composed of 3 silicon atoms and 3 oxygen atoms, as the first organosiloxane monomer with cyclosiloxane backbone, as shown in general formula (11) below. In addition, the cyclosiloxane backbone can be 5-membered cyclosiloxane of cyclopentasiloxane, 6-membered cyclosiloxane of cyclohexasiloxane or cyclosiloxanes having more members than that.

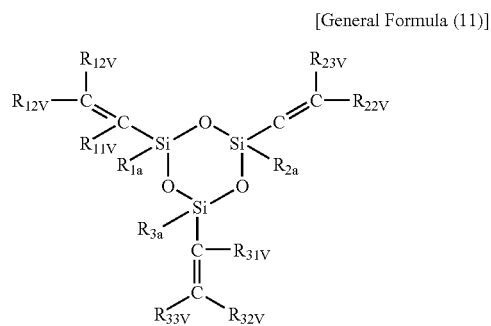

[General Formula (11)]

General Formula (11): 3-Membered Cyclosiloxane Having a Plurality of Unsaturated Hydrocarbon Groups.

In this formula, R11V, R12V, R13V, R1a, R21V, R22V, R23V, R2a, R31V, R32V, and R33V denote hydrocarbon groups, phenyl groups or hydrogen.

According to the first organosiloxane monomer with cyclosiloxane backbone, all the hydrocarbon groups bonded to the silicon atoms included in the cyclosiloxane backbone do not have to be unsaturated. Nevertheless, as the unsaturated hydrocarbon group to be bonded to the silicon atom, it desirably includes the unsaturated hydrocarbon group capable of selective activation with a low energy electron in the plasma. The above example shows the organosiloxane having a molecular structure where the silicon atom is directly bonded to the vinyl group, or bonded to C=C site of the unsaturated hydrocarbon group. Also, the silicon atom of the organosiloxane can be bonded to, via the saturated hydrocarbon chain, vinyl group ($CH_2$=CH—), ethinyl group (HC≡C—), and cyclobutenyl group. Furthermore, the hydrocarbon chain may include the unsaturated hydrocarbon group including a plurality of vinyl groups ($CH_2$=CH—) and ethinyl groups (HC≡C—).

To configure the organosiloxane copolymer, at least 2 or more independent sites capable of addition polymerization reaction are necessary in the cyclosiloxane molecule, especially, for the cyclosiloxanes to be continuously connected via the unsaturated hydrocarbon groups, at least 2 or more silicon atoms should be bonded to the unsaturated hydrocarbon groups, in the cyclosiloxane. Furthermore, in forming the network structure of the organosiloxane copolymer film, among all silicon atoms configuring the cyclosiloxane, preferably 3 or more silicon atoms are bonded to the unsaturated hydrocarbon groups. Especially, all silicon atoms configuring the cyclosiloxane should preferably be bonded by at least one of the unsaturated hydrocarbon group capable of addition polymerization, repsectively.

Second Embodiment

The organosiloxane copolymer film according to the present invention uses the first organosiloxane monomer with cyclosiloxane backbone and the second organosiloxane monomer with straight-chain siloxane backbone as raw materials. One embodiment of the second organosiloxane with straight-chain siloxane backbone, is a straight-chain divinyl siloxane having a molecular structure where the terminal silicon atom of the straight-chain siloxane shown in general formula (12) below is bonded directly to vinyl group ($CH_2$=CH—) or bonded to C=C site of the unsaturated hydrocarbon group.

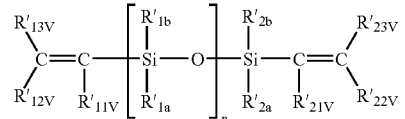

[General Formula (12)]

General Formula (12): Divinyl Straight-Chain Siloxane

In the formula, R'1a, R'1b, R'11V, R'12V, R'13V, R'2a, R'2b, R'21V, R'22V, and R'23V denote hydrocarbon groups, phenyl groups, aliphatic hydrocarbon groups, or hydrogen. Moreover, n denotes an integer of 1 or more. Now, as examples of straight-chain divinyl siloxane having a repeating unit n=1 shown in general formula (12), are tetramethyldivinylsiloxane (TMVS) of general formula (13) and dimethyldiphenyldivinylsiloxane of general formula (14).

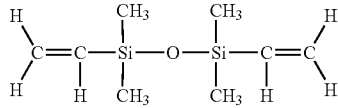

[General Formula (13)]

General Formula (13): tetramethyldivinylsiloxan

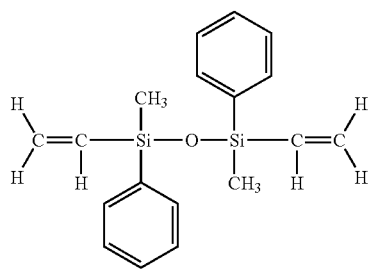

[General Formula (14)]

General Formula (14): dimethyldiphenyldivinylsiloxane

As another embodiment which is usable as the second organosiloxane, monovinylsiloxane shown in general formula (15) below where silicon atoms in the straight-chain siloxane are bonded to the unsaturated hydrocarbon groups, and vinylsiloxane shown in general formula (16) below where all silicon atoms in the straight-chain siloxane are bonded to unsaturated hydrocarbon groups. Furthermore, divinylsiloxane where all of the silicon atoms are bonded by 2 unsaturated hydrocarbon groups are also included.

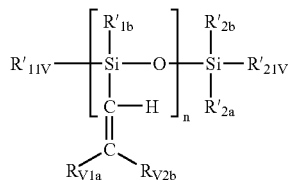

[General Formula (15)]

General Formula (15): Straight-Chain Monovinylsiloxane

In the formula, R'11V, R'21V, R'1b, R'2a, RV1a, RV1b, and R'2V denote hydrocarbon groups, phenyl groups or hydrogen, and n denotes an integer of 2 or more.

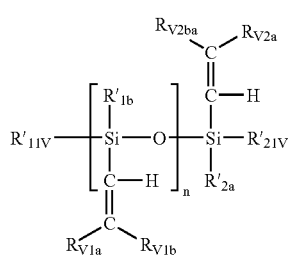

[General Formula (16)]

General Formula (16): Straight-Chain Divinylsiloxane

In the formula, R'11V, R'21V, R'1b, R'2a, RV1a, RV1b, RV2a, and RV2b denote hydrocarbon groups, phenyl groups or hydrogen, and n denotes an integer of 1 or more, As another embodiment usable as the second organosiloxane includes vinyl-terminated monovinyl siloxane shown in general formula (17) below where both the straight-chain siloxane and the terminal of a silicon atom are bonded to the unsaturated hydrocarbon group, and a vinyl-terminated divinyl siloxane shown in general formula (18) below.

[General Formula (17)]

General Formula (17): Vinyl-Terminated Monovinyl Siloxane

In the formula, R'11V, R'12V, R'13V; RV1a, RV1b, R'1b, R'2a, R'2b, R'21V, R'22V, and R'23V denote hydrocarbon groups, phenyl groups and hydrogen, and n denotes an integer of 1 or more.

[General Formula (18)]

General Formula (18): Vinyl-Terminated Divinylsiloxane

In the formula, R'11V, R'12V, R'13V, RV1a, RV1b, R'1b, R'2a, RV1a, RV1b, R'21V, R'22V, and R'23V denote hydrocarbon groups, phenyl groups and hydrogen, and n denotes an integer of 1 and more.

Furthermore, in the second organosiloxane monomer with straight-chain siloxane bankbone, the hydrocarbon group related to the addition polymerization reaction can be aliphatic phenyl group or aliphatic hydrocarbon group having a backbone capable of open-ring addition such as cyclobutene or benzocyclobutene. Examples are monobenzocyclobutene-monovinyl-terminated siloxane shown in general formula (19) below, and bisbenzocyclobutene-terminated siloxane shown in general formula (20) below, and bisvinyl-terminated methylbenzocyclobutenesiloxane shown in general formula (21) below.

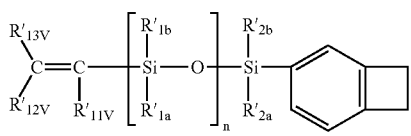

[General Formula (19)]

General Formula (19): Monobenzocyclobutene-Monovinyl-Terminated Siloxane

In the formula, R'11 V, R'12V, R'13V, R'1a, R'1b, R'2a and R'2b denote hydrocarbon groups, phenyl groups, and hydrogen, and n denotes an integer of 1 or more.

[General Formula (20)]

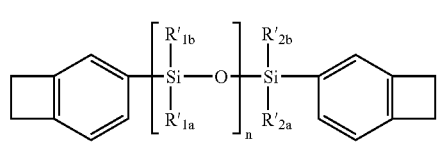

General Formula (20): Bisbenzocyclobutene-Terminated Siloxane

In the formula, R'1a, R'1b, R'2a, and R'2b denote hydrocarbon groups, phenyl groups, or hydrogen, and n denotes an integer of 1 or more.

[General Formula (21)]

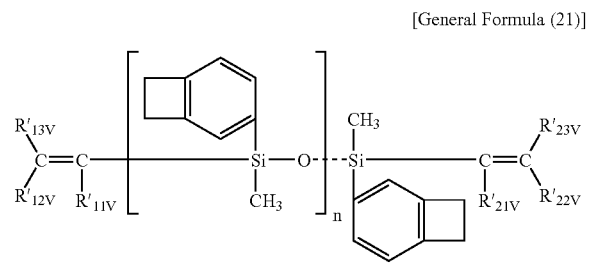

General formula (21): bisdivinyl-terminated methylbenzocyclobutenesiloxane

In the formula, R'11V, R'12V, R'13V, R'21V, R'22V, and R'23V denote hydrocarbon groups, phenyl groups or hydrogen, and n denotes an integer of 1 or more.

Now, the examples of bisdivinyl-terminated methylbenzocyclobutenesiloxane having a repeating unit n=1, shown in general formula (21), are bisvinyl-dibenzocyclobutene-dimethyl-siloxane of chemical formula (22) and bismethylvinyl-dibenzocyclobutene-dimethyl-siloxane of chemical formula (23).

[Chemical formula (22)]

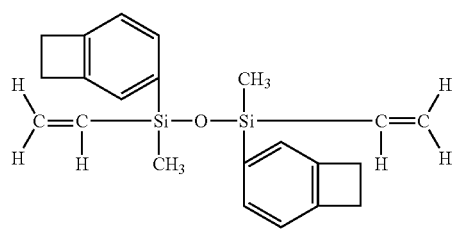

Chemical Formula (22): bisvinyl-dibenzocyclobutene-dimethyl-siloxane

[Chemical formula (23)]

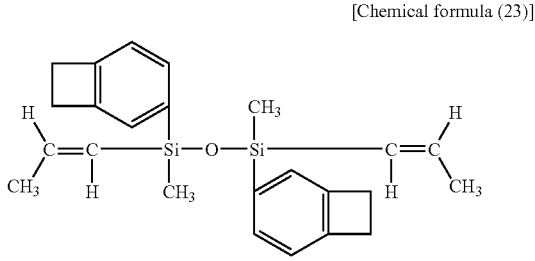

Chemical formula (23): bismethylvinyl-dibenzocyclobutene-dimethyl-siloxane. In addition, the second organosiloxane monomer with straight-chain siloxane backbone, the hydrocarbon group related to the addition polymerization reaction can be vinylbenzocyclobutene structure shown in chemical formula (24) below. As an example, bisvinyl-benzocyclobutene-tetramethylsiloxane shown in the previously-described formula (1), furthermore, bisvenzocyclobutene-divinyldimethyldihydrosiloxane shown in chemical formula (25) below, or bisbenzocyclobutene-divinyltetrahydrosiloxane shown in chemical formula (26) below.

[Chemical formula (24)]

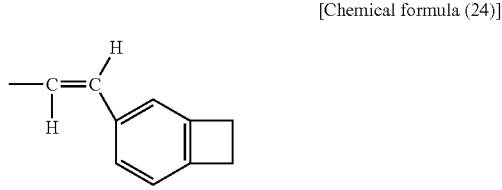

Chemical Formula (24): Vinylbenzocyclobutene Structure

[Chemical formula (1)]

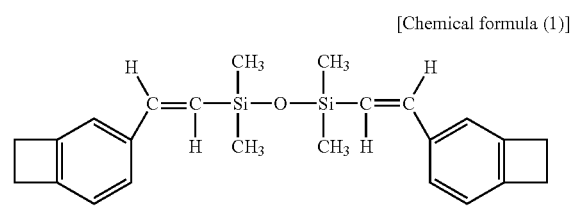

Chemical Formula (1): bisvinylbenzocyclobutene-divinyltetramethylsiloxane

[Chemical formula (25)]

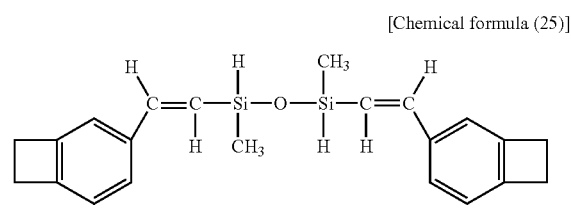

Chemical Formula (25): bisbenzocyclobutene-divinyldimethyldihydrosiloxane

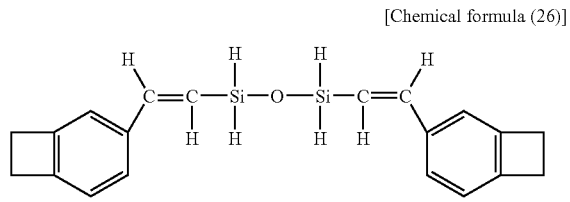

Chemical Formula (26): bisbenzocyclobutene-divinyltetrahydrosiloxane

In above examples, those having the molecular structures where the silicon atoms are directly bonded to vinyl groups or C=C site of the unsaturated hydrocarbon groups or aliphatic hydrocarbon groups having the backbone structure capable of open-ring addition such as cyclobutene or benzocyclobutene are illustrated. The straight-chain organosiloxane monomers having the structures where the silicon atoms are bonded to the vinyl ($CH_2$—CH—), ethinyl group (HC≡C—), and cyclobutenyl group, and benzocyclobutenyl group, via the saturated hydrocarbon chain are also included. In other words, the straight-chain second organosiloxane monomer having the straight-chain siloxane backbone usable in the present invention has at least a structure where the straight-chain siloxane is bonded to the hydrocarbon group capable of addition polymerization reaction, and preferably includes the straight-chain siloxane where 2 or more hydrocarbon groups capable of addition polymerization reaction independently. In addition, the second organosiloxane monomer having straight-chain siloxane backbone preferably has 3 or more sites capable of addition polymerization reaction. Furthermore, in the present invention, the "straight-chain siloxane" in a broadest possible sense comprises all siloxanes except for the cyclosiloxane. For example, the "chain siloxane" structure interaction, the structure of which is connected by the hydrocarbon chain itself, is not included in the narrowly-defined "straight-chain siloxane", however, it can exhibit performance as "straight-chain siloxane" possessed by the second organosiloxane monomer of the present invention. Accordingly, it is usable as the second organosiloxane monomer having straight-chain siloxane backbone. Moreover, in the present invention, as the second organosiloxane monomer which is the structural unit of the organosiloxane copolymer film, the previously-described mixture of the straight-chain siloxane can be utilized.

Third Embodiment

According to the third embodiment, as the first organosiloxane with cyclosiloxane backbone, tetramethylvinyl-tetrahydro-cyclotetrasiloxane (TVTMCTS) of chemical formula (8) is utilized, and as the second organosiloxane with stright-chain siloxane backbone, bisbenzocyclobutene-divinyltetramethylsiloxane of chemical formula (1) is utilized, for producing the organosiloxane copolymer film.

TVTMCTS (molecular weight=346) of chemical formula (8) has a structure where the methyl groups, and the vinyl groups as the unsaturated hydrocarbon groups, are bonded respectively on each silicon atom on the 4-membered cyclosiloxane backbone, and the material is a liquid at the room temperature. On the other hand, BCBDVS (molecular weight=390) of chemical formula (1) has a structure where benzocyclobutenyl group is bonded to the vinylene group (—CH=CH—) structure as the unsaturated hydrocarbon group capable of addition polymerization, to each silicon atom terminal on the straight-chain siloxane (—Si—O—Si—) backbone, and it is a liquid at the room temperature. In other words, both has at least 2 of more unsaturated hydrocarbon groups, respectively. Specifically, the first organosiloxane has 4 unsaturated hydrocarbon groups capable of addition polymerization, and the second organosiloxane has a total of 4 reaction sites in the unsaturated hydrocarbon groups capable of addition polymerization. The TVTMCTS and BCBDVS accordingly are separately vaporized, these are mixed beforehand, the mixed gas is passed through the He plasma, and the vinyl group of TCTMCTS and the benzocyclobutenyl group of BCBDVS are selectively volatilized.

Figure 6:
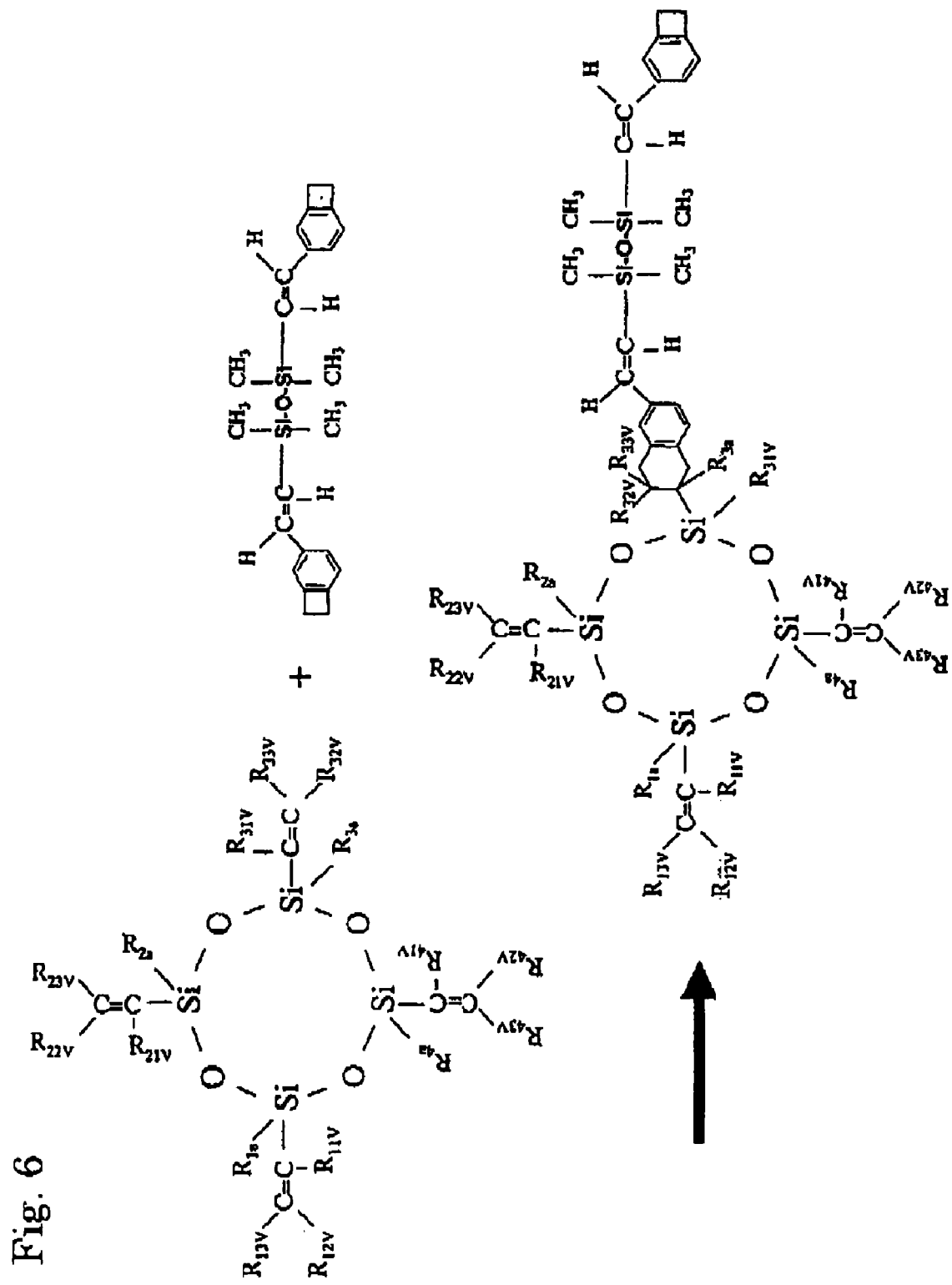
FIG. 6 is a schematic drawing showing the polymerization reaction using the plasma excitation, for producing the organosiloxane copolymer film as one embodiment of the present invention, by using the BCBDVS monomer gas which is a straight-chain siloxane, and by using the TVT-MCTS monomer gas which is a cyclosiloxane.

As a result of this, according to the sites activated by the plasma, the addition polymerization reaction progresses on the heated substrate, and the open-ring addition type polymer formation shown in FIG. 6 takes place. FIG. 6 shows schematically the polymerization reaction using the plasma excitation, for producing the organosiloxane copolymer film as one embodiment of the present invention, by using BCBDVS monomer gas which is a straight-chain siloxane, and by using TVTMCTS monomer gas which is a cyclosiloxane. In the drawing, R11V=H, R12V=H, R13V=H, R1a=$CH_3$, R21V=H, R22V=H, R23V=H, R2a=$CH_3$, R31V=H, R32V=H, R33V=H, R3a=$CH_3$, R41V=H, R42V=H, R42V=H, R43V=H, and R4a=$CH_3$. In other words, due to a low energy electron collision in the He plasma, accompanied by the activation of benzocyclobutene structure, the cyclobutene ring section causing the open-ring shown in chemical formula (2) and a vinyl group ($CH_2$=CH—) forms the TVTMCTS and BCBDVS copolymers via the cyclo ring formation process performing the addition polycrmization reaction shown in chemical formula (3). Accordingly, the unsaturated hydrocarbon group part included in the hydrocarbon group bonded to the siloxane, as a result of the selective activation, the addition polymerization is easily generated, and the desired reaction path design is possible.

Figure 8:
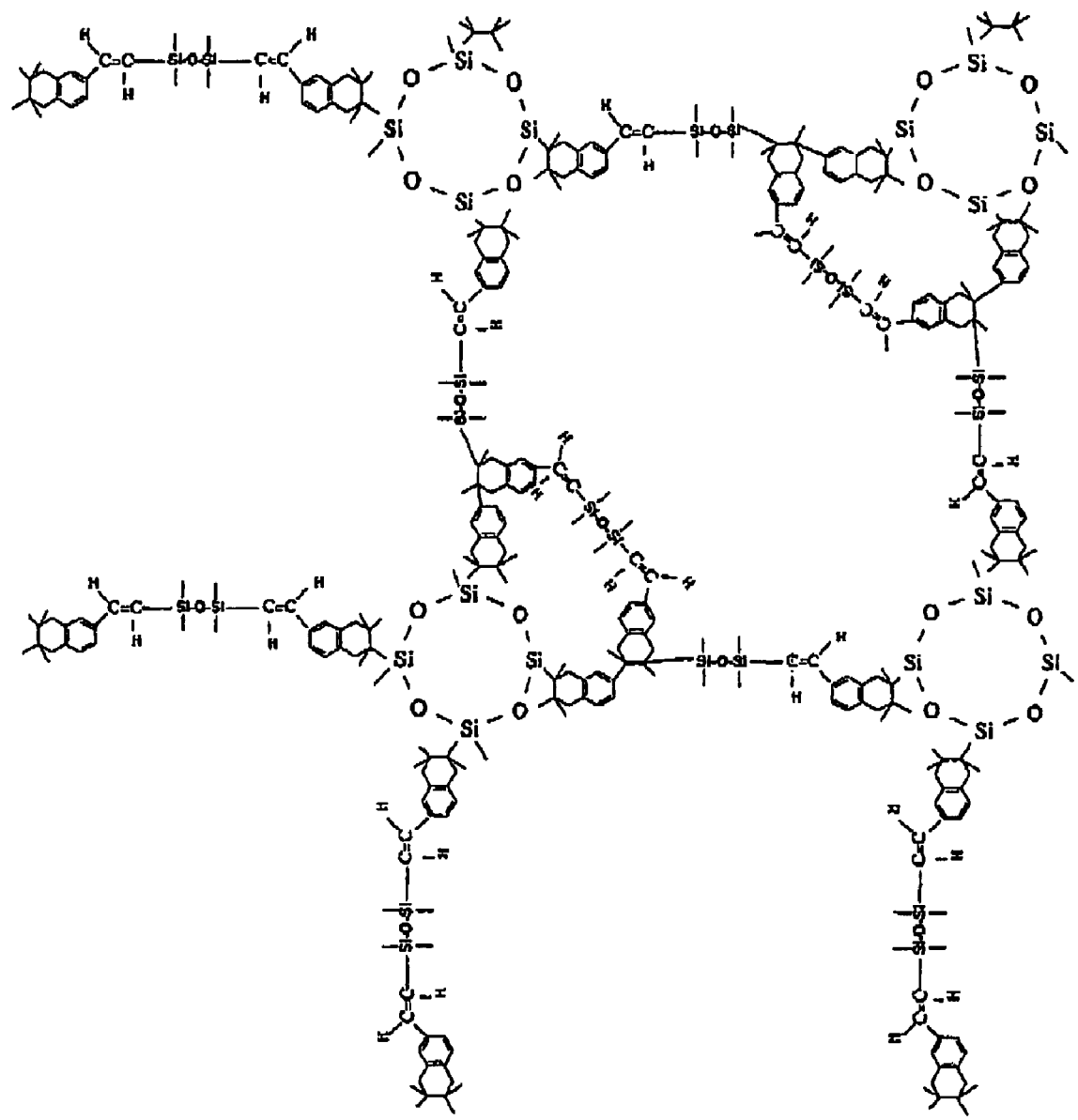
FIG. 8 is a schematic drawing showing an example of the formation path of the organosiloxane copolymer film according to the present invention, and shows the network structure formation by the polymerization reaction of the cyclosiloxane and the straight-chain siloxane accompanied by the selective plasma excitation, and shows the bridge formation after the straight-chain siloxane interaction.
Figure 9:
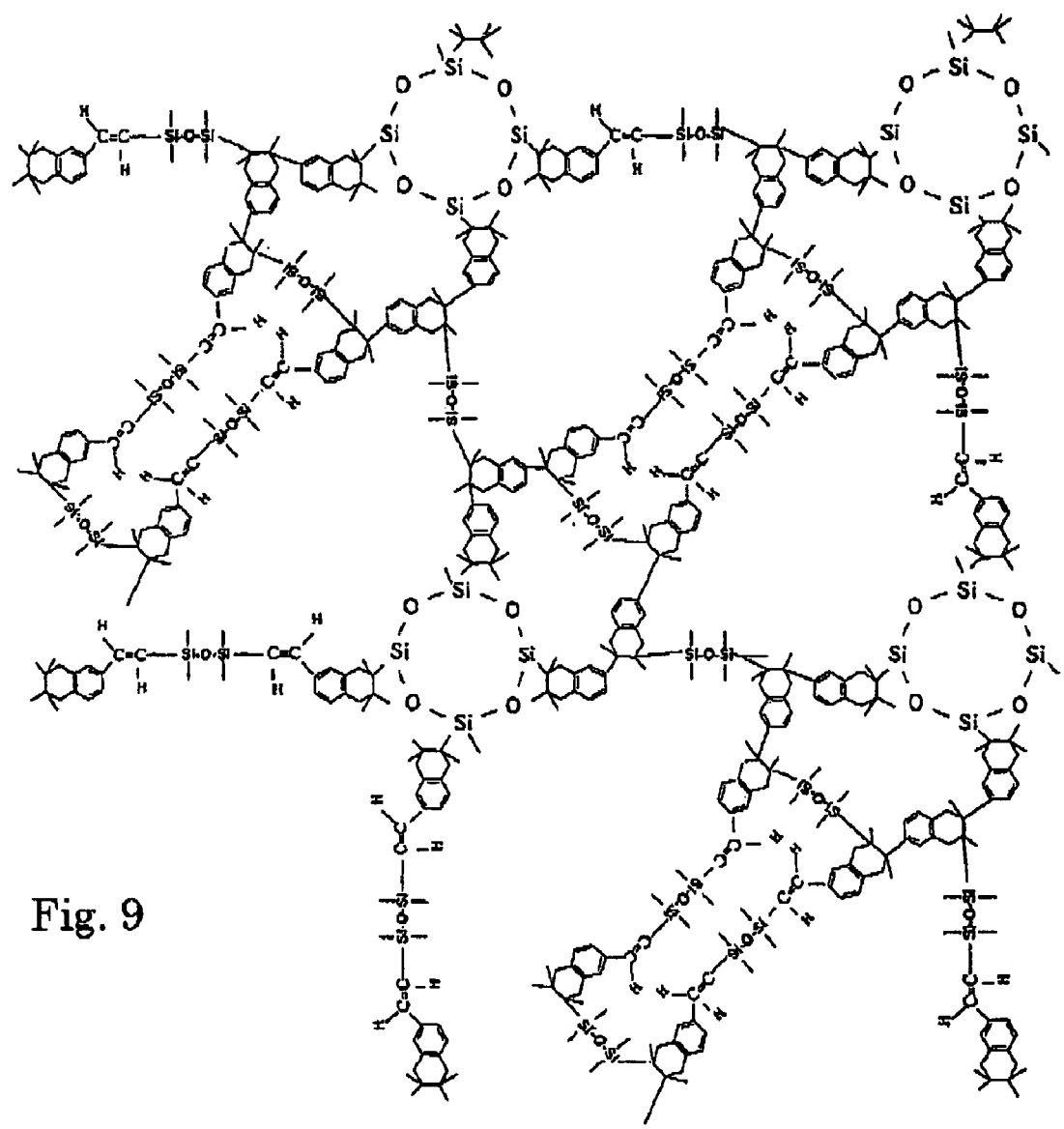
FIG. 9 is a schematic drawing showing an example of the formation processing of the organosiloxane copolymer film according to the present invention, and shows the network structure formation by the polymerization reaction of the cyclosiloxane and the straight-chain siloxane accompanied by the selective plasma excitation, and shows the 2-dimensional bridge structure formation after the straight-chain siloxane interaction.

At this point, there's no means to carry out the time trend analysis of the strict reaction path during the copolymer film formation via the plasma excitation process. Nevertheless, FIG. 7 to FIG. 9 show schematically the reaction path of bridge structure formation in the copolymer film including some estimates, and its time trend (side chain is not illustrated in some part).

Figure 7:
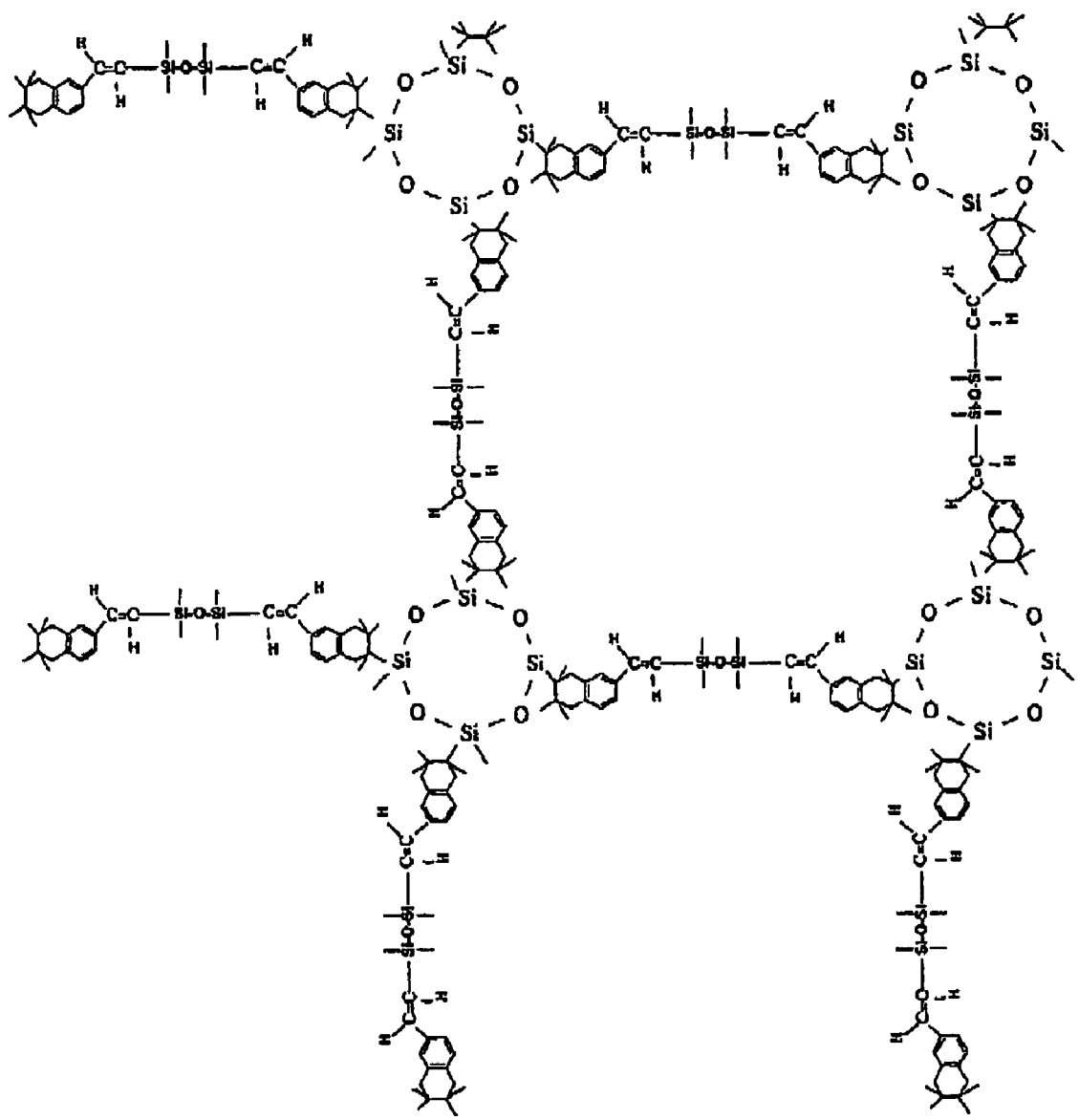
FIG. 7 is a schematic drawing showing an example of the formation process of organosiloxane copolymer film according to the present invention, and the formation of network structure by polymerization reaction of cyclosiloxane and straight-chain siloxane, accompanied by the selective plasma excitation.

FIG. 7 shows an example of the formation process of the organosiloxane copolymer film, and the formation of network structure by polymerization reaction of cyclosiloxane and straight-chain siloxane, accompanied by the selective plasma excitation. FIG. 8 shows an example of the formation path of the organosiloxane copolymer film of the present invention, and shows the network structure formation by the polymerization reaction of the cyclosiloxane and the straight-chain siloxane accompanied by the selective plasma excitation, and shows the bridge formation after the straight-chain siloxane interaction. FIG. 9 shows an example of the formation processing of the organosiloxane copolymer, and shows schematically a network structure formation by the polymerization reaction of the cyclosiloxane and the straight-chain siloxane accompanied by the selective plasma excitation, and the 2-dimensional bridge structure formation after the straight-chain siloxane interaction.

First of all, along with the progress in the addition polymerization reaction of the selectively activated sites by plasma, as shown in FIG. 7, a large network structure organosiloxane copolymer film is formed whereby the cyclosiloxanes are connected by the straight-chain siloxanes. Furthermore, inside a BCBDVS unit of the copolymer film, the unreacted vinylene group (—CH=CH—) exists, and another BCBDVS generates at the same time the addition polymerization of cyclobutene part inside the benzocyclobutene structure in respect to the vinylene group (—CH=CH—) inside the BCBDVS unit. As a result of this, as shown in FIG. 8, the bridge structure is further induced caused by the polymerization reaction of BCBDVS unit interaction, which is a straight-chain siloxane. At this time, if the ratio of BCBDVS contained in the mixed gas is high, as shown in FIG. 9, more highly dense bridge structure is further induced caused by the polymerization reaction of BCBDVS unit interaction.

A network structure where the cyclosiloxane-derived units are dispersed is being formed inside the obtained copolymer film. Depending on the ratio of BCBDVS included in the mixed gas, the organosiloxane copolymer film inducing additional bridge structure is grown on the heated substrate caused by the polymerization reaction of BCBDVS unit interaction further. Now, an existence ratio of the straight-chain siloxane derived unit and the cyclosiloxane derived unit contained in the copolymer film is determined by depending on mole ratios and supply rates of the BCBDVS monomer gas and the TVTMCTS monomer gas contained in the mixed gas. Moreover, the density of the obtained copolymer film depends on the mole ratios and supply rates of the BCBDVS monomer gas and the TVTMCTS monomer gas. The higher the content ratio of the BCBDVS derived unit which is a straight-chain siloxane, the higher the density. At this time, the siloxane unit density per unit area also increases, the deposition property is high, and the dielectric constant is also high.

Next, the organosiloxane copolymer film formation process composed of the cyclosiloxane and straight-chain siloxane is described, which is obtained through the addition polymerization reaction of TVTMCTS and BCBDVS, using the deposition apparatus of the organosiloxane copolymer film shown in FIG. 3.

First of all, according to the initial state of the vaporization controller, a vaporization controller valve 37, a valve 41 and a valve 18 are opened. An exhaust pump 14 is used to form a vacuum inside the reaction chamber 1, an exhaust piping 16, a waste liquid piping 18, a vaporization controller 34, and a vaporization raw material pipings 38. The vaporization temperature of the organosiloxane monomer inside the vaporization supplying system 61 is appropriately selected depending on the saturated vaporization pressure necessary to maintain the desired supply amount. It is also important to select the vaporization temperature which is capable of maintaining the organic monomer partial pressure range, without causing the blockage due to an aggregation in the middle of piping, and without the change in polymer quality or being decomposed during the piping process of vapor-supplying the organic monomer. Moreover, the vaporization raw material supply pipings 38 are heated by beaters for preventing the aggregation inside the pipings so that its component material should withstand heat. Alternatively, the organic monomer partial pressure must be selected which is capable of setting the heating temperature within the heat resistance temperature range of the piping component material. Moreover, the heating temperature of the piping is monitored by the thermocouples being placed at various positions in the piping, which controls the piping heating heater 3 for constantly setting the temperature. Next, a valve 45 is opened, and a carrier gas (He) 26 is supplied from a carrier gas supply piping 40, to a vaporization controller 30 via a gas flow controller 31, which is further flown into the reaction chamber 1 via the vaporization raw material supply pipings 38 and the valve 18, and exhausted outside of the apparatus with an exhaust pump 14 via the exhaust piping 16. In the case of using the TVTMCTS and BCBDVS as raw materials, the vaporization temperature is set in the range of 170 degrees Celsius to 210 degrees Celsius. On the other hand, the flow amount of He gas is selected in a range of 300 sccm to 500 sccm. Under the range of previously-described conditions, the total pressure P of the vaporization controller 34 is in a range of 2 to 4 Torr. The total pressure inside the reaction chamber 1 is 1.0 Torr. Moreover, a silicon substrate (semiconductor substrate) 5 for forming the semiconductor integrate circuit can be heated to a range of 300 degrees Celsius to 400 degrees Celsius by a substrate heating section 6 set inside the reaction chamber 1. Now, in the case of using the TVTMCTS monomer and BCBDVS monomer, the substrate heating temperature is appropriately selected in a range of 200 degrees Celsius to 450 degrees Celsius.

According to the vaporization supply system 61 selecting the previously-described vaporization condition, the TVTMCTS monomer and the BCBDVS monomer are supplied to the reaction chamber 1 via the respective vaporization raw material supply pipings, along with the He gas, respectively. The mixed gas composed of the TVTMCTS monomer gas and the BCBDVS monomer gas is homogenized at the shower head 7 section inside the reaction chamber 1, and after that it is sprayed uniformly throughout the whole substrate surface by the uniform flow distribution.

Below the shower head, under the state of not generating the He plasma, not much organosiloxane film is formed by spraying the mixed gas to the heated substrate. Accordingly, to the earthed substrate heating section, the RC power of 13.56 MHZ is applied to the shower head, and the He plasma is generated under the shower head, and the raw material organosiloxane monomer is activated. In the activation process by this plasma, preferably, the hydrocarbon groups (4-membered carbon ring and vinyl group) capable of addition polymerization which are respectively present in the TVTMCTS monomer and the BCBDVS monomer are selectively activated as much as possible. The RC power for generating plasma caused by the He carrier gas is selected in a range of 300 W to 100 W.

The mixed gas of the TVTMCTS monomer gas and the BCBDVS monomer gas receive activation accordingly during a passage through the He plasma, by giving more thermal energy on the heated substrate surface, the copolymerization reaction of the TVTMCTS monomer and the BCBDVS monomer is generated, and the organosiloxane copolymer film is formed. On the other hand, the unpolymerized monomer gas reaches a cooling trap 14 which is cooled to about 20 degrees Celsius via the exhaust piping 16, and is aggregated inside the cooling trap 14 and collected so that it does not enter the exhaust pump 8.

As the total supply amount, after the pre-determined amounts of the TVTMCTS monomer gas and the BCBDVS monomer gas are vapor-supplied, first of all, the RF power supply is stopped, the film growth is terminated, and after that, each monomer gas supply is stopped, and the semiconductor substrate 5 remaining in the reaction chamber 1 is taken out.

Figure 10:
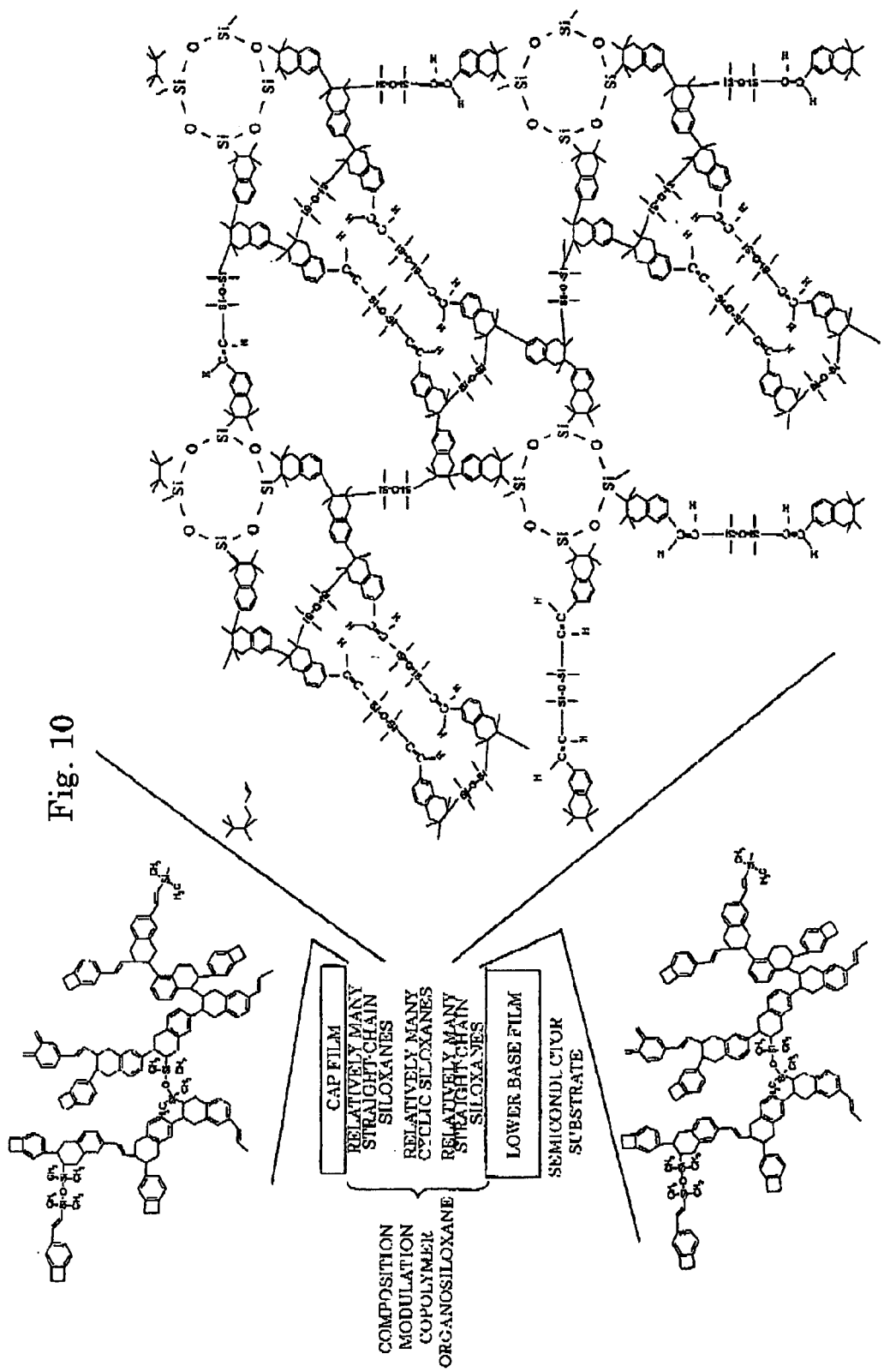
FIG. 10 is a schematic drawing showing a structure of the organosiloxane copolymer film according to the present invention having a composition modulation in the thickness direction, preferably used as the interlayer insulation film in the semiconductor device.

FIG. 10 shows a structure of the organosiloxane copolymer film having the composition modulation in the thickness direction, preferably used as an interlayer insulation film in the semiconductor device. As shown in FIG. 10, according to the processes above, during the film formation, a relative supply amount of the TVTMCTS monomer gas which is a cyclosiloxane and the BCBDVS monomer gas which is a straight-chain siloxane is changed. This way, the composition modulation type organosiloxane copolymer film with the content ratio of the straight-chain siloxane derived unit and the cyclosiloxane derived unit changing in the thickness direction is obtained. For example, in the state of RF power of 100W, as for the mass flow rate conversion, the BCBDVS monomer gas only is supplied at a supply rate of 0.1 g/min ($2.6 \times 10^{-4}$ mol/min) for 10 seconds, and after that, while maintaining the supply rate of the BCBDVS monomer constant, a supply rate of the TVTMCTS monomer gas is increased to 0.08 g/min ($2.6 \times 10^{-4}$ mol/min) for 10 seconds. The state of the TVTMCTS supply rate of 0.08 g/min and the BCBDVS supply rate 0.1 g/min is maintained for 20 seconds, then the supply speed of TVTMCTS is decreased from 0.08 g/min to 0 g/min in 10 seconds. After that, only the BCBDVS monomer gas is supplied at the supply rate of 0.1 g/min for 10 seconds, and the RF power is terminated.

As a result of this, the BCBDVS film which is an intricate straight-chain organosiloxane film of 50 nm thick is formed on an interface layer of the silicon substrate heated to 350 degrees Celsius. 75 nm thick part on top of it is a transition region of the increasing relative content ratio of the cyclosiloxane derived unit against the straight-chain siloxane derived unit, followed by the formation of the organosiloxane copolymer film of approximately 1:1 content ratio of the straight-chain siloxane derived unit and the cyclosiloxane derived unit of 200 nm thickness. Furthermore, on top of it is a transition region where the content ratio of the cyclosiloxane derived unit is decreasing against the straight-chain siloxane derived unit, which is 75 nm thick. On the uppermost layer is coated with the BCBDVS film which is an intricate intricate straight-chain organosiloxane of 50 nm thickness. Now, in FIG. 10, a previously-described representative multilayer structure comprised of an interface layer, a transition region, a constant composition copolymer film, a transition region, and an uppermost layer is described. For this purpose, the three-layer including the interface layer, the constant composition copolymer film, and the uppermost layer is mentioned all having different structures. However, as described previously, the supply amounts of the monomers are independently controlled, therefore, the copolymer film showing continuous structure change in the thickness direction is obtained by changing the supply amount continuously. Moreover, in the transition region, it is possible to control to the form showing a sudden structural change by changing the supply amount suddenly.

Now, the dielectric constant k of the sole BCBDVS film which is a straight-chain siloxane is 2.6. The dielectric constant k of the organosiloxane copolymer film of BCBDVS+TVTMCTS (1:1), as the straight-chain siloxane and the cyclosiloxane, is 2.4. In the single TVTMCTS film, the cyclosiloxane derived unit has a porous structure, and its dielectric constant k is ranging from 2.1 to 2.4, however, the single TVTMCTS film is lacking in the deposition property to the inorganic insulation film and the lower substrate. As it is, its application to the multi-layer wiring is difficult. According to the FT-IR measurement, in the single BCBDVS layer film, a stretching vibration of the straight-chain siloxane recognizes an adsorption peak of 1055 cm$^{-1}$. In the TVTMCTS/BCBDVS copolymer film, in addition to a stretching vibration of the straight-chain siloxane of 1055 cm$^{-1}$, the adsorption peak of 1085 cm$^{-1}$ is recognized, which is caused by stretching vibration of the cyclosiloxane.

As illustrated above, according to the production method of the organosiloxane copolymer film according to the present invention, a plurlaity of organosiloxane monomer gases are used as raw materials, and their supply amounts are independently and continuously controlled during the formation, and the structure of organosiloxane film is changed continuously in the thickness direction by changing the supply amount ratio. Henceforth, as for the interfaces with other materials, the interface layers have the composition excellent in film mechanical strength and deposition property, and as a whole film, an effective dielectric constant is low, and the composition modulation of organosiloxane copolymer film is continuously formed. Furthermore, since the vaporized growth under low pressure is utilized, the organosiloxane monomer mobility is large in the substrate surface, and the organosiloxane copolymer film is obtained in which the cyclosiloxane derived unit and the straight-chain siloxane derived unit are evenly mixed at the molecular level, via the hydrocarbon chain, formed by the additional polymerization.

Fourth Embodiment

Figure 11:
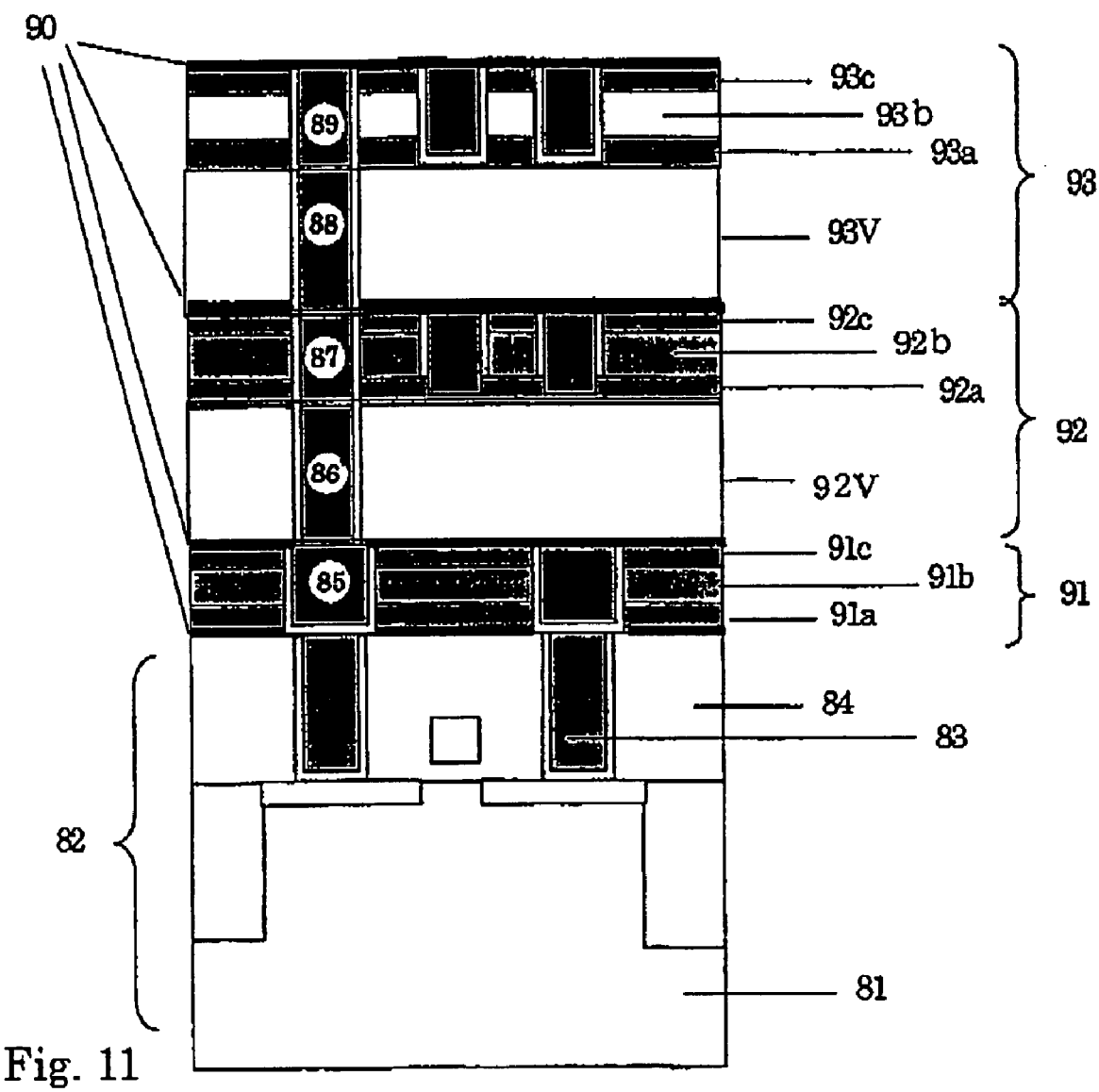
FIG. 11 is a schematic drawing showing an example of the organosiloxane copolymer film according to the present invention, particularly, the composition modulation type organosiloxane copolymer film utilized as a wiring insulation film whereby the multi-layer wiring structure is configured on the semiconductor device.

FIG. 11 shows a case example of adopting the organosiloxane copolymer film produced utilizing the plasma excitation type addition polymerization reaction of the present invention to the multilayer wiring of the MOSFET device. According to the semiconductor device shown in FIG. 11, the TVTMCTS/BCBDVS organosiloxane copolymer film mentioned in the third embodiment is adpoted as 3 wiring insulation layers of copper wirings 85, 87 and 89 (M1, M2 and M3) on the MOSFET 82 formed on the silicon substrate 81. The first copper wiring layer (M1) 85 is formed on a tangstan compact plug 83 formed inside the inorganic interlayer insulation film 84 on the MOSFET 82. On the surface of the inorganic interlayer insulation film 84, as a copper spreading barrier gap film, an extremely thin film carbon-containing silicon nitrate film (SiCN) of less than 10 nm is formed.

The wiring insulation film 91 of the first copper wiring layer 85 has the 3-layer structure including: an organosiloxane film 91a consisting of the straight-chain siloxane that only uses the BCBDVS of the second organosiloxane monomer; an organosiloxane copolymer film 91b consisting of the cyclosiloxane and the straight-chain siloxane that use both the BCBDVS mentioned above and TVTMCTS of the first organosiloane monomer with cyclosiloxane backbone; and an organosiloxane film 91c consisting of the straight-chain siloxane that only uses the BCBDVS. In other words, a continuously-formed composition modulation type organosiloxane copolymer film 91 comprises the BCBDVS films 91a and 91c excellent in the mechanical strength and the deposition property that are placed as the interface layers of the lower base and upper layer. The BCBDVS film with the dielectric constant k=2.5 to 2.7 include 1 straight-chain siloxane group (—Si—O—Si—) per unit backbone. The straight-chain siloxane comprises a complex bridge structure via the benzocyclohexane ring created by the addition polymerization, as a result, the film is excellent in mechanical strength and excellent in the deposition property with the copper spreading barrier film. On the other hand, the TVTMCTS/BCBDVS organosiloxane copolymer film 91b of the intermediate layer being continuously formed, has a structure forming a complex bridge of the straight-chain siloxane backbone via the benzocyclohexane ring or hydrocarbon chain, in respect to the cyclosiloxane backbone having pores. Within the intermediate layer, due to a presence of the pores caused by the cyclosiloxane backbone, the whole film is porous, and its effective dielectric constant k, given that the content ratio of the TVTMCTS/BCBDVS is 1:1, is about k=2.4.

The effective dielectric constant of the composition modulation type organosiloxane copolymer film used in the wiring insulation film 91 for the first copper wiring layer 85 accordingly depends on the film thickness ratio of the BCBDVS/TVTMCTS film 91b of the intermediate layer and the BCBDVS films 91a and 91c of the interface layers, therefore, the total thickness of the BCBDVS films 91a and 91c of the interface layers are ideally 20% the thickness of the BCBDVS/TVTMVTS film 91b of the intermediate layer. For example, in the case of the copper wiring 85 having the thickness of 300 nm, and provided that the thickness of the BCBDVS film 91a, the BCBDVS/TVTMVTS film 91b, and the BCBDVS film 91c are 15 nm/270 mm/15 nm, respectively, the effective dielectric constant of the wiring insulation film 91 is about 2.5.

The composition modulation type organosiloxane copolymer film used for the wiring insulation film 91 is grown using the deposition apparatus shown in FIG. 3. Herewith, the substrate heating temperature is 350 degrees Celsius, and the frequency of 13.56 MHz and the RF electric power of 100 W are applied to the shower head, and the He plasma is generated by using the He carrier gas. At first, in the initial stage of the film formation, the BCBDVS monomer only is supplied, and the BCBDVS film of 15 nm thickness is grown. After that, to attain an equivalent mole supply ratio of the BCBDVS monomer and the TVTMCTS monomer, for example, the BCBDVS monomer supply rate of 0.1 g/min, and the TVTMCTS monomer supply rate of 0.08/min are supplied, and the BCBDVS/TVTMCTS organosiloxane copolymer film of 270 nm thickness is grown. After that, again, the BCBDVS monomer only is supplied, and the BCBDVS film of 15 nm thickness is grown. Now, the supply amount of the BCBDVS monomer is set constant, and the supply amount of the TVTMCTS is continuously reduced, and the BCBDVS/TVTMCTS copolymer film with changing composition in the whole layer is formed. At this time, the film configuration has a high concentration of the siloxane group in the vicinity of the interfaces with the upper layer and the lower base, and has a gradually decreasing concentration in the intermediate layer. In the wiring gutter formed in the first wiring interlayer insulation film, after coating its side and base by TaN barrier film of 10 nm thickness, and the first single damocene copper wire layer 85 is formed inside the gutter.

After that, the copper spreading barrier film 90 of 10 nm thickness is grown on the first copper wiring layer. Example of the copper spreading barrier film is SiCN film of the dielectric constant ranging from 3.0 to 3.5 grown by emitting a silan gas (SiH$_4$) for 3 seconds, the bistrimethyl-silyl-carbodiimido of chemical formula (27) is vaporized, which is induced into the plasma composed of He/NH$_3$ mixed gas or He/N$_2$ mixed gas, and which is grown on the substrate heated to 250 degrees Celsius to 350 degrees Celsius coating the first copper wiring layer. The RF power used in generating the plasma is about 100 W.

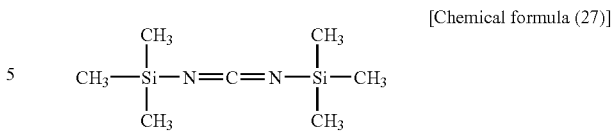

[Chemical formula (27)]

Chemical Formula (27): bistrimethyl-silyl-carbodiimido

The SiCN film can also be formed by inducing a trimethylsilane ((CH$_3$)3SiH) into a plasma consisting of He/NH$_3$ mixed gas. The dielectric constant k of the SiCN obtained by this method is normally larger than a SiCN film using the bistrimethyl-silyl-carbodiimido as a raw material, which is k=3.0 to 3.5.

After that, a via insulation film 92V is grown on the copper spreading barrier film 90. As the via insulation film 92V, a silicon oxide film produced in a plasma CVD using a silane gas, which is excellent in the mechanical strength, or an amorphous SiOCH film obtained by, for example, decomposing a paramethyl-dimethoxy silane gas (PM-DMOS) of chemical formula (28) below, which is a sole organic siloxane not including the unsaturated hydrocarbon chain, are used. As required, after accumulation of the via insulation film 92V, its surface layer is flattened by scraping off by using the chemical mechanical polishing method.

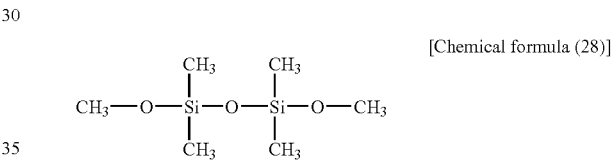

[Chemical formula (28)]

Chemical Formula (28): paramethyl-dimethoxy Silane

After that, the second wiring insulation films 92a, b, and c are grown. Herewith, as the second wiring insulation films 92a, b, and c, the 3-layer structure film including a BCBDVS film 92a, a BCBDVS/TVTMCTS organosiloxane copolymer film 92b, and a BCBDVS film 92c are consecutively grown, by using the method illustrated in the third embodiment. Laminated hard mask (not illustrated) of SiCN/SiO$_2$ is used to form the wiring gutters to the wiring insulation film 92a, b, and c. Furthermore, a via is formed to the via insulation film 92V. As the etching gas, the C$_4$F$_8$/N$_2$/O$_2$ system gas is used accordingly. After that, by using ionization sputtering method, a Ta/TaN or a TiW/TiWN laminated barrier film (75 nm/75 nm) is grown, furthermore, copper seed film of 1000 angstrom is grown. On the Cu seed film, a Cu film of 7000 angstrom is grown by using the electrolysis plating method, annealed at 300 degrees Celsius for 30 minutes, and then the grain growth of the Cu plated film is carried out. A barrier metal consisting of TiWN or Ta/TaN and Cu film, which are present at surface other than the via and the wiring gutter section is removed by the chemical mechanical polishing method, and the wiring structure embedding a copper in the via 86 and the wiring gutter 87 are formed as one. The second copper wiring layer 92 is formed according to the series of processes accordingly. By repeating the same processing, the multi-layer wirings using the organosiloxane copolymer film is formed as the interlayer insulation film on a transistor 82 of the silicon semiconductor substrate, in which the cyclosiloxane derived units and the straight-chain siloxane derived units undergo addition polymerization to be connected by the hydrocarbon chains.

Henceforth, by using the growth method of the organosiloxane copolymer film according to the present invention, as for the vaporization reaction system where the organosiloxane copolymer film is formed, for example, from the BCB-DVS monomer which is one embodiment of the straight-chain siloxane and the TVTMCTS monomer which is one embodiment of the cyclosiloxane as raw materials, the respective content ratio of the siloxane backbone derived units can be changed from 0% to 100%. Accordingly, as for the wiring interlayer insulation films of each wiring layer such as LSI multi-layer wirings, if the required physical properties of the film differ, for example, the mechanical strength, the deposition property or the dielectric constant, by controlling the supply rates of the plural kinds of organosiloxane monomer gases as raw materials, the property of the obtained copolymer film is changed.

In the illustrated growth example of the copolymer film, the BCBDVS is used as the straight-chain siloxane, and the TVTMCTS is used as the cyclosiloxane, however, the characteristic point of the present invention lies in mixing the plurality of straight-chain siloxane monomer gases and the cyclosiloxane monomer gases, and the vaporization growth of the orgaonsiloxane copolymer film having the desired composition is possible. For example, among the various cyclosiloxanes mentioned in the first embodiment and various straight-chain siloxanes mentioned in the second embodiment, a plurality of organosiloxanes are selected as required and mixed, and the organosiloxane copolymer film having the composition corresponding to their supply ratios can be vaporized and grown. Furthermore, in addition to the mixed gas of 2 or more organosiloxane monomers capable of self polymerization, furthermore, a polymer auxiliary gases such as acetylene or ethylene, trivinylsilane, and divinylsilane are added, to carry out the vaporization growth of the organosiloxane film including the auxiliary copolymer unit.

Fifth Embodiment

Figure 12:
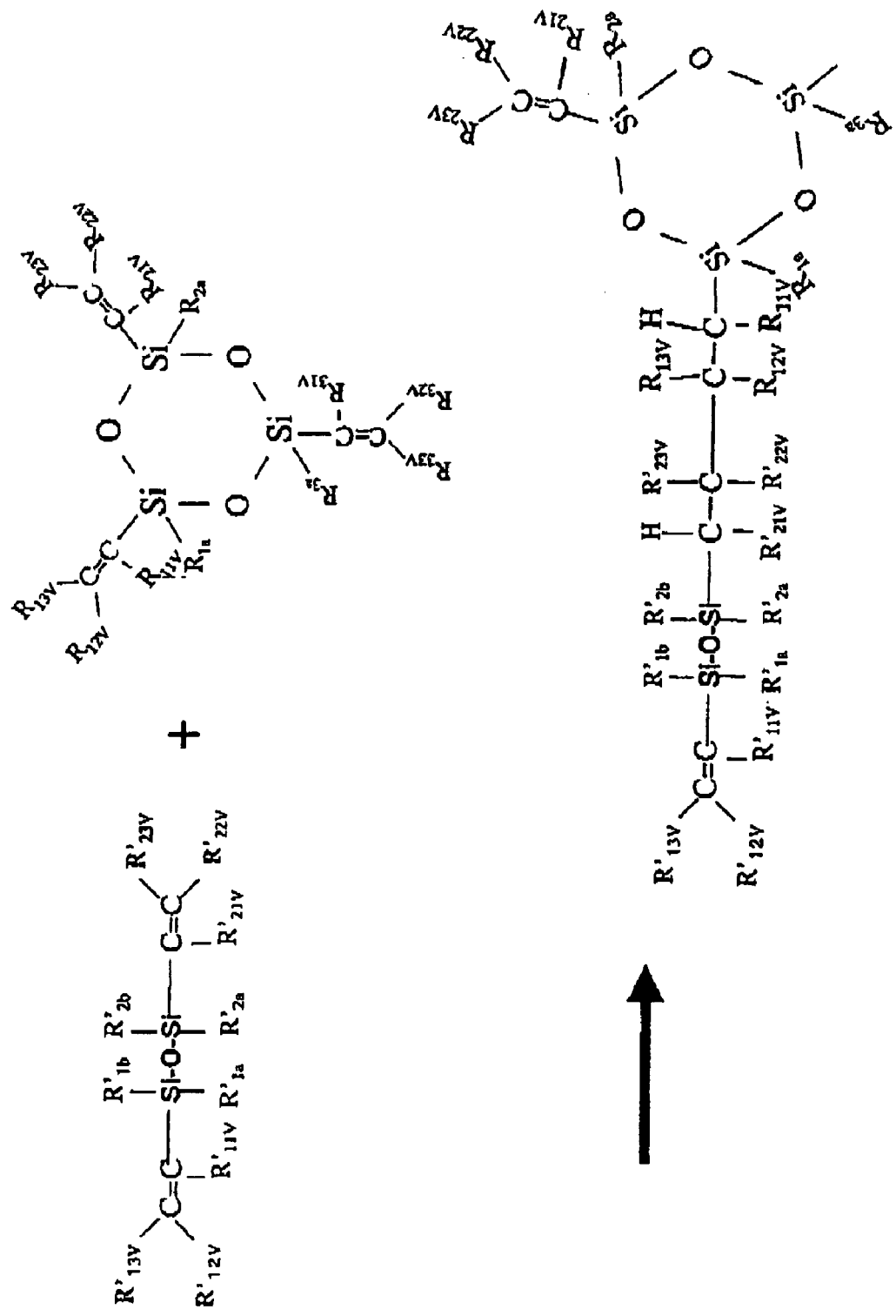
FIG. 12 is a schematic drawing showing the polymerization reaction using the plasma excitation in forming the organosiloxane copolymer film which is one embodiment of the present invention by using the divinylsiloxanes group shown in general formula (12) as the straight-chain siloxane and the 3-membered cyclosiloxanes groups shown in general formula (11) as the cyclosiloxane.
Figure 13:
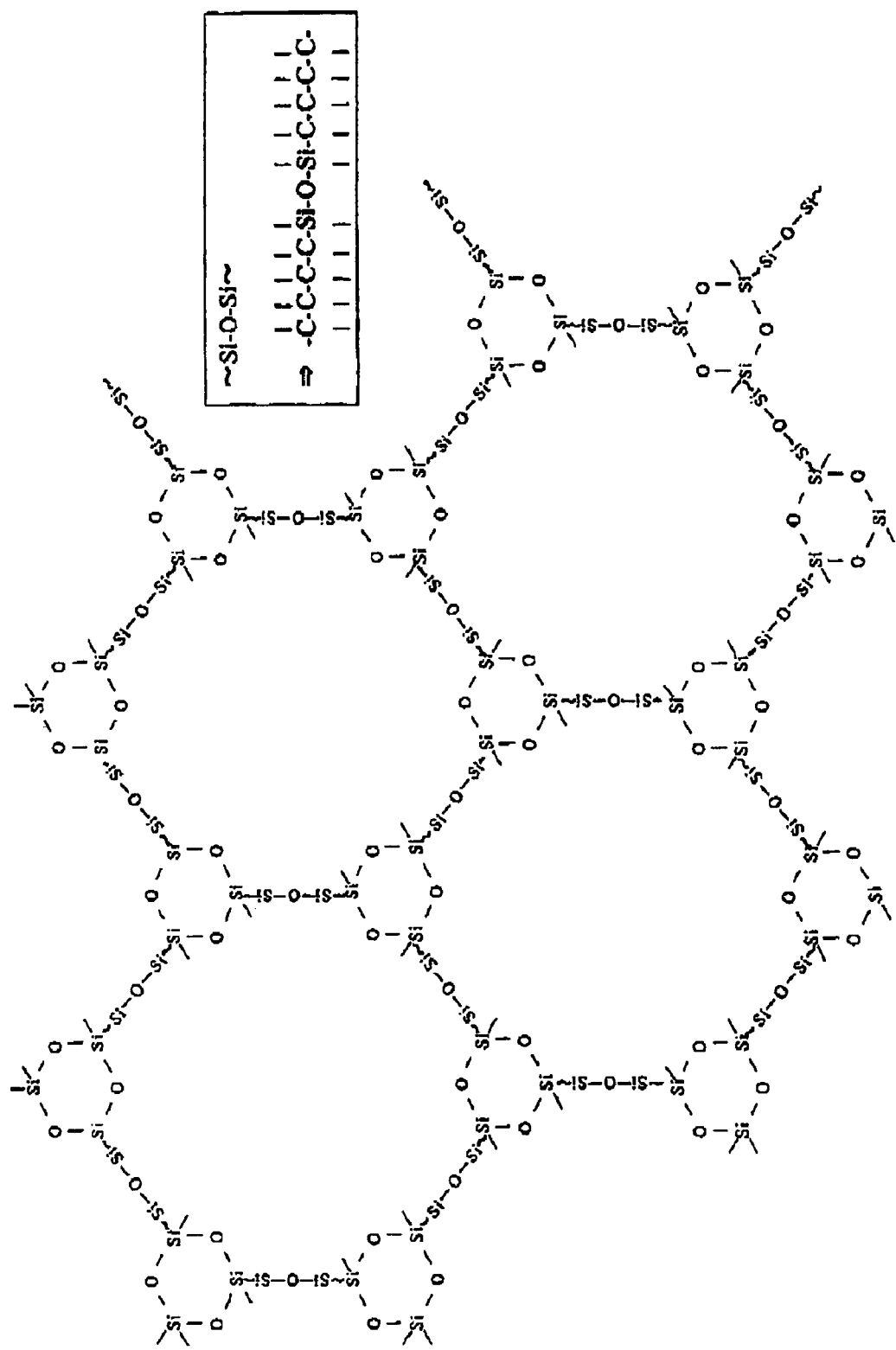
FIG. 13 is a schematic drawing showing a formation of the hexagonal lattice network structure by the polymerization reaction of the divinylsiloxane group and the 3-membered siloxane group, accompanied by the selective plasma excitation which is an example of the formation processing of the organosiloxane copolymer film.

In the fifth embodiment, the 3-membered cyclosiloxane group shown in general formula (11) above as the first organosiloxane having cyclosiloxane backbone is used, and the divinylsiloxane group shown in general formula (12) above as the second organosiloxane having straight-chain backbone is used, to form the copolymer film. FIG. 12 shows the polymerization reaction using the plasma excitation in forming the organosiloxane copolymer film which is one embodiment of the present invention by using the divinylsiloxanes group shown in general formula (12) as the straight-chain siloxane and the 3-membered cyclosiloxanes groups shown in general formula (11) as the cyclosiloxane. FIG. 13 shows a formation of the hexagonal lattice network structure by the polymerization reaction of the divinylsiloxane group and the 3-membered siloxane group, accompanied by the selective plasma excitation which is an example of the formation processing of the organosiloxane copolymer film. Under the combination of these raw materials, the organosiloxane copolymer film obtained at the polymer condition using the previously-described plasma excitation, the additional polymerization reaction occurs in between the unsaturated hydrocarbon group on silicon atom of the 3-membered cyclosiloxane group and unsaturated hydrocarbon group of the divinylsiloxane group terminal shown in FIG. 12. As shown in FIG. 13, the copolymer film has a hexagonal lattice as basic film configuration, in which the 3-membered cyclosiloxane backbone derived from the 3-membered cyclosiloxane groups as the lattice points which are connected in between by the divinylsiloxane group derived bridge chain. Now, by using a mixture of the 3-membered cyclosiloxane and the 4-membered cyclosiloxane as the first organosiloxane having cyclosiloxane backbone, the organosiloxane copolymer film having a network structure where the hexagonal lattice and square lattice are intermixed, is grown on the semiconductor substrate.

INDUSTRIAL APPLICABILITY

The organosiloxane copolymer film according to the present invention, by mixing in plural as raw materials the first organosiloxane gas with cyclosiloxane backbone and the second siloxane gas with straight-chain backbone, the organosiloxane copolymer film can be vaporized and grown, including the network structure formed by the cyclosiloxane derived unit and the straight-chain siloxane derived unit. Furthermore, these organosiloxanes are vaporized, and while controlling their supply amounts independently, and while changing the supply ratio of the mixed gas, it is supplied to the reaction chamber, so that the configuration ratio of the cyclosiloxane and the straight-chain siloxane is changing in the growth thickness direction, and the organosiloxane copolymer film is obtained. Moreover, in the obtained organosiloxane copolymer film, its cyclosiloxane backbone included has pores surrounded by the siloxanes, and the pores become a structural body incorporating the network structure consisting of the straight-chain siloxanes. The size of pores surrounding the siloxane is determined by controlling the number of membered rings of the cyclosiloxane which is a raw material. Moreover, the pore density has an advantage of being able to be controlled by changing the gas mixture ratio with the first organosiloxane and the second organosiloxane supplied as the raw materials. Using this advantage, at the interfaces contacting the inorganic insulation film of the lower base and the inorganic insulation film of the upper layer, an organosiloxane copolymer film including many straight-chain siloxanes with the excellent mechanical strength and deposition property is positioned, and at the intermediate layer section positioned in between the upper and lower interfaces, an organosiloxane copolymer film including many cyclosiloxane derived units having a small bulk density is positioned. As a whole film, on average, the effective dielectric constant at the interfaces and the intermediate layer is low. At the same time, the interlayer insulation films having the excellent mechanical strength and deposition property at the upper and lower interfaces are obtained.

What is claimed is:

1. An organosiloxane copolymer film having plural kinds of organosiloxane derived composition units,
    wherein the plural kinds of organosiloxane derived composition units comprises at least a first organosiloxane with a cyclosiloxane backbone derived unit and a second organosiloxane with a straight-chain siloxane backbone derived unit;
    wherein the organosiloxane copolymer film forms a bridge structure by bonding a plurality of second organosiloxanes to the first organosiloxane; and
    wherein the copolymer film has a film configuration in which a content ratio of the first orgonosiloxane backbone derived unit and the second organosiloxane with a straight-chain siloxane backbone derived unit is changing in the film thickness direction.

2. An organosiloxane copolymer film according to claim 1, wherein the copolymer film is configured so that an upper and a lower planes of the copolymer film in the thickness direction are both contacting an inorganic insulation film, wherein the content ratio of the second organosiloxane derived unit is higher in the vicinity of an interface with the inorganic insulation film at both the upper plane and lower plane, than the content ratio of the second organosiloxane derived unit at an inner portion of the copolymer film; and wherein a density of the copolymer film in the vicinity of the interface is larger than a density of the copolymer film in the inner portion of the copolymer film.

3. A semiconductor device comprising art interlayer insulation film consisting of an organosiloxane film, wherein the organosiloxane film is an organosiloxane copolymer film having plural kinds of organosiloxane derived composition units;

wherein the plural kinds of organosiloxane derived composition units comprises at least beth a first organosiloxane with a cyclosiloxane backbone derived unit and a second organosiloxane with a straight-chain siloxane backbone derived unit;

wherein a bridge structure is formed by bonding a plurality of second organosiloxanes to the first organosiloxane;

wherein the organosiloxane copolymer film is sandwiched by inorganic insulators;

wherein the content ratio of the second organosiloxane derived unit is higher in the vicinity of an interface with an inorganic insulation film at both an upper and a lower planes, the content ratio of the second organosiloxane derived unit at an inner portion of the copolymer film; and wherein a wiring layer is formed within the organosiloxane copolymer film embedding a copper film therein.

4. A vapor deposition method for depositing an organosiloxane copolymer film having plural kinds of organosiloxane derived composition units on a substrate, wherein the plural kinds of organosiloxane derived composition units comprise at least a first organosiloxane with a cyclosiloxane backbone derived unit and a second organosiloxane with a straight-chain siloxane backbone derived unit and wherein the organosiloxane copolymer film forms a bridge structure by bonding a plurality of second organosiloxanes to the first organosiloxane, wherein the method comprises the steps of;

vaporizing a first organosiloxane monomer with cyclosiloxane backbone;

vaporizing a second organosiloxane monomer with straight-chain siloxane backbone;

supplying a vaporized first organosiloxane monomer gas at a predetermined supply rate;

supplying a vaporized second organosiloxane monomer gas at a predetermined supply rate;

forming a mixed gas by mixing the supplied first organosiloxane monomer gas and the supplied second organosiloxane monomer gas;

introducing the mixed gas in a reaction chamber under reduced pressure; and spraying the introduced mixed gas onto a heated substrate after passing through a plasma atmosphere generated in the reaction chamber, wherein the vapor deposition method grows a copolymer film forming a bridge structure by reacting the first organosiloxane monomer and the second organosiloxane monomer in the mixed gas sprayed onto the substrate, and thereby bonding a plurality of second organosiloxanes to the first organosiloxane.

5. A vapor deposition method according to claim 4, wherein a supply rate ratio of the first organosiloxane monomer gas and the second organosiloxane monomer gas is changed by changing supply rates of the first organosiloxane monomer gas and the second organosiloxane monomer gas respectively, and thereby in response to the change of the supply rate ratio, a content ratio of the first organosiloxane derived unit and the second organosiloxane derived unit is changing in the film thickness direction.

6. The organosiloxane copolymer film according to claim 1, wherein the bridge structure is formed by bonding in plural the first organosiloxane and the second organosiloxane via an organic group.

* * * * *